(12) United States Patent
Yoon et al.

(10) Patent No.: US 12,080,234 B2
(45) Date of Patent: Sep. 3, 2024

(54) DISPLAY DEVICE

(71) Applicant: LG Display Co., Ltd., Seoul (KR)

(72) Inventors: MunChae Yoon, Seoul (KR); SangWook Lee, Paju-si (KR); JeongHyeon Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/077,611

(22) Filed: Dec. 8, 2022

(65) Prior Publication Data
US 2023/0186854 A1 Jun. 15, 2023

(30) Foreign Application Priority Data

Dec. 10, 2021 (KR) .................. 10-2021-0177087
Oct. 7, 2022 (KR) .................. 10-2022-0129079

(51) Int. Cl.
*G09G 3/3266* (2016.01)
*G09G 3/3233* (2016.01)
*G09G 3/32* (2016.01)

(52) U.S. Cl.
CPC ......... *G09G 3/3233* (2013.01); *G09G 3/3266* (2013.01); *G09G 3/32* (2013.01); *G09G 2300/0408* (2013.01); *G09G 2300/0426* (2013.01); *G09G 2300/0842* (2013.01); *G09G 2310/0202* (2013.01); *G09G 2310/0267* (2013.01); *G09G 2310/08* (2013.01); *G09G 2320/0257* (2013.01); *G09G 2320/0261* (2013.01)

(58) Field of Classification Search
CPC ............... G09G 3/3233; G09G 3/3266; G09G 2300/0426; G09G 3/3208; G09G 3/32; G09G 2300/0413; G09G 2310/0286; G09G 2310/0202; G09G 2320/0257; G09G 2320/043
See application file for complete search history.

(56) References Cited

U.S. PATENT DOCUMENTS

| | | | |
|---|---|---|---|
| 2019/0206330 A1* | 7/2019 | Kim | G09G 3/3283 |
| 2020/0143753 A1* | 5/2020 | Park | G09G 3/3291 |
| 2020/0273399 A1* | 8/2020 | Qin | G09G 3/3266 |

* cited by examiner

*Primary Examiner* — Dennis P Joseph
(74) *Attorney, Agent, or Firm* — Fenwick & West LLP

(57) ABSTRACT

A display device may comprise a substrate, a plurality of driving transistors on the substrate, a plurality of anode electrodes connected with the plurality of driving transistors, a light emitting layer on the plurality of anode electrodes, and a plurality of split cathode electrodes on the light emitting layer. Each of the plurality of split cathode electrodes may alternate between a first state applied with a cathode voltage and a second state of floating not applied with the cathode voltage.

24 Claims, 18 Drawing Sheets

DISPLAY DEVICE

CROSS-REFERENCE TO RELATED APPLICATIONS

This application claims priority from Republic of Korea Patent Application No. 10-2021-0177087, filed on Dec. 10, 2021, and Republic of Korea Patent Application No. 10-2022-0129079, filed on Oct. 7, 2022, each of which are hereby incorporated by reference in its entirety.

BACKGROUND

Field

Embodiments of the disclosure relate to display devices.

Description of Related Art

As the information society develops, demand for display devices for displaying images is increasing in various forms. Various types of display devices, such as liquid crystal display devices and organic light emitting display devices, are being utilized in recent years.

Upon displaying video, conventional display devices may cause an afterimage of the previous image or motion blur due to slow video response, degrading image quality.

SUMMARY

As such, conventional displays suffer from afterimage or motion blur issues. Various methods have been proposed to prevent or mitigate motion blur. However, conventional proposed methods require a complicated driving method or may cause side effects. The present application describes a novel method for preventing motion blur without the need for complicated driving or causing side effects.

Embodiments of the disclosure may provide a display device capable of effectively preventing or at least reducing motion blur by a new method without complicated driving.

Embodiments of the disclosure may provide a display device including a cathode patterning structure and a cathode driving system for preventing or at least reducing motion blur.

According to embodiments of the disclosure, there may be provided a display device comprising a substrate, a plurality of driving transistors on or over the substrate, a plurality of anode electrodes connected with the plurality of driving transistors, a light emitting layer on the plurality of anode electrodes, and a plurality of split cathode electrodes on the light emitting layer.

In the display device according to embodiments of the disclosure, each of the plurality of split cathode electrodes may alternate between a first state applied with a cathode voltage and a second state of floating not applied with the cathode voltage.

In the display device according to embodiments of the disclosure, each of the plurality of split cathode electrodes may be disposed in a direction crossing the plurality of data lines. Each of the plurality of split cathode electrodes may be disposed in a direction parallel to the plurality of gate lines.

In the display device according to embodiments of the disclosure, each of the plurality of split cathode electrodes may overlap anode electrodes, included in one subpixel row, among the plurality of anode electrodes. Each of the plurality of split cathode electrodes may overlap anode electrodes, included in two or more subpixel rows, among the plurality of anode electrodes.

The display device according to embodiments of the disclosure may further comprise at least one cathode voltage line receiving the cathode voltage.

In the display device according to embodiments of the disclosure, the electrical state of each of the plurality of split cathode electrodes may repeat a shorted state of being electrically connected with the at least one cathode voltage line and a floating state of being electrically separated from the at least one cathode voltage line.

In the display device according to embodiments of the disclosure, while at least one split cathode electrode among the plurality of split cathode electrodes is in the shorted state of being electrically connected with the at least one cathode voltage line, at least one subpixel row overlapping the at least one split cathode electrode may emit light.

In the display device according to embodiments of the disclosure, while at least one split cathode electrode among the plurality of split cathode electrodes is in the floating state of being electrically separated from the at least one cathode voltage line, at least one subpixel row overlapping the at least one split cathode electrode may not emit light.

According to embodiments of the disclosure, there may be provided a display device comprising a substrate, a plurality of driving transistors on or over the substrate, a plurality of anode electrodes connected with the plurality of driving transistors, a light emitting layer on the plurality of anode electrodes, and a plurality of split cathode electrodes disposed on the light emitting layer.

In the display device according to embodiments of the disclosure, at least one of the plurality of split cathode electrodes may have a different electrical state from the rest.

In the display device according to embodiments of the disclosure, among the plurality of split cathode electrodes, at least one split cathode electrode may be in a first state applied with a cathode voltage, and a rest may be in a second state of floating not applied with the cathode voltage.

In the display device according to embodiments of the disclosure, subpixels including anode electrodes overlapping the split cathode electrode in the second state among the plurality of split cathode electrodes may not emit light.

According to embodiments of the disclosure, there may be provided a display device capable of effectively preventing motion blur by a new method without complicated driving.

According to embodiments, there may be provided a display device including a cathode patterning structure and a cathode driving system for preventing motion blur.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
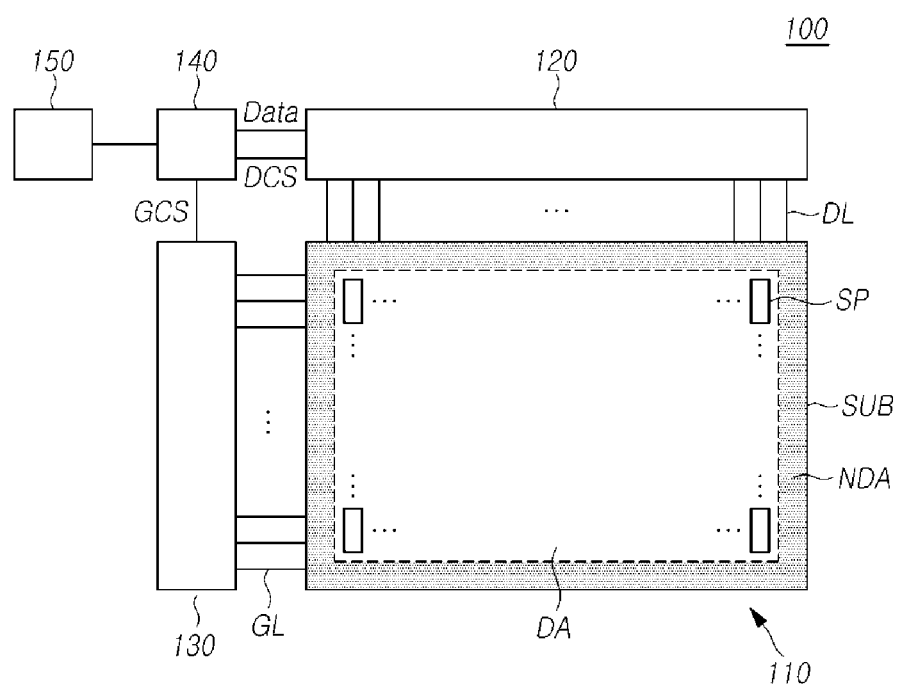
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view illustrating a system configuration of a display device 100 according to embodiments of the disclosure.

Referring to FIG. 1, a display driving system of a display device 100 according to embodiments of the disclosure may include a display panel 110 and driving circuits for driving the display panel 110.

The display panel 110 may include a display area DA in which images are displayed and a non-display area NDA in which no image is displayed. The display panel 110 may include a plurality of subpixels SP disposed on a substrate SUB for image display. For example, the plurality of subpixels SP may be disposed in the display area DA. In some cases, at least one subpixel SP may be disposed in the non-display area NDA. At least one subpixel SP disposed in the non-display area NDA is also referred to as a dummy subpixel.

The display panel 110 may include a plurality of signal lines disposed on the substrate SUB to drive the plurality of subpixels SP. For example, the plurality of signal lines may include a plurality of data lines DL and a plurality of gate lines GL. The signal lines may further include other signal lines than the plurality of data lines DL and the plurality of gate lines GL depending on the structure of the subpixel SP. For example, the other signal lines may include driving voltage lines and reference voltage lines.

The plurality of data lines DL and the plurality of gate lines GL may cross each other. Each of the plurality of data lines DL may be disposed while extending in a first direction. Each of the plurality of gate lines GL may be disposed while extending in a second direction. Here, the first direction may be a column direction and the second direction may be a row direction. In the disclosure, the column direction and the row direction are relative. For example, the column direction may be a vertical direction and the row direction may be a horizontal direction. As another example, the column direction may be a horizontal direction and the row direction may be a vertical direction. For ease of description, it is assumed below that each data line DL is disposed to extend in the vertical direction, and each gate line GL is disposed to extend in the horizontal direction.

The driving circuit may include a data driving circuit 120 for driving the plurality of data lines DL and a gate driving circuit 130 for driving the plurality of gate lines GL. The driving circuit may further include a controller 140 for controlling the data driving circuit 120 and the gate driving circuit 130.

The data driving circuit 120 is a circuit for driving the plurality of data lines DL, and may output data signals (also referred to as data voltages) corresponding to an image signal to the plurality of data lines DL. The gate driving circuit 130 is a circuit for driving the plurality of gate lines GL and generate gate signals and output the gate signals to the plurality of gate lines GL.

The controller 140 may start a scan according to the timing implemented in each frame and control data driving at an appropriate time according to the scan. The controller 140 may convert the input image data input from the outside to meet the data signal format used in the data driving circuit 120 and supply the converted image data to the data driving circuit 120.

The controller 140 may receive display driving control signals, along with the input image data, from the external host system 150. For example, the display driving control signals may include a vertical synchronization signal VSYNC, a horizontal synchronization signal HSYNC, an input data enable signal DE, and a clock signal.

The controller 140 may generate data driving control signals DCS and gate driving control signals GCS based on display driving control signals input from the host system 150. The controller 140 may control the driving operation and driving timing of the data driving circuit 120 by supplying the data driving control signals DCS to the data driving circuit 120. The controller 140 may control the driving operation and driving timing of the gate driving circuit 130 by supplying the gate driving control signals GCS to the gate driving circuit 130.

The data driving circuit 120 may include one or more source driver integrated circuits SDIC. Each source driver integrated circuit SDIC may include a shift register, a latch circuit, a digital-to-analog converter DAC, and an output buffer. In some cases, each source driver integrated circuit SDIC may further include an analog-digital converter ADC.

For example, each source driver integrated circuit SDIC may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate or may be connected to the substrate. In other words, the gate driving circuit 130 that is of a GIP type may be disposed in the non-display area NDA of the substrate. The gate driving circuit 130 that is of a chip-on-glass (COG) type or chip-on-film (COF) type may be connected to the substrate.

Meanwhile, at least one of the data driving circuit 120 and the gate driving circuit 130 may be disposed in the display area DA. For example, at least one of the data driving circuit 120 and the gate driving circuit 130 may be disposed to be non-overlapping with the subpixels SP or to overlap all or some of the subpixels SP.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The controller 140 may be implemented as a separate component from the data driving circuit 120, or the controller 140 and the data driving circuit 120 may be integrated into an integrated circuit (IC). The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit. The controller 140 may transmit/receive signals to/from the data driving circuit 120 according to one or more predetermined interfaces. The interface may include, e.g., a low voltage differential signaling (LVDS) interface, an EPI interface, and a serial peripheral interface (SP).

The display device 100 according to embodiments of the disclosure may be a self-emission display device in which the display panel 110 emits light by itself. When the display device 100 according to the embodiments of the disclosure is a self-emission display device, each of the plurality of subpixels SP may include a light emitting element. For example, the display device 100 according to embodiments of the disclosure may be an organic light emitting diode display in which the light emitting element is implemented as an organic light emitting diode (OLED). As another example, the display device 100 according to embodiments of the disclosure may be an inorganic light emitting display device in which the light emitting element is implemented as an inorganic material-based light emitting diode. As another example, the display device 100 according to embodiments of the disclosure may be a quantum dot display device in which the light emitting element is implemented as a quantum dot which is self-emission semiconductor crystal.

Figure 2:
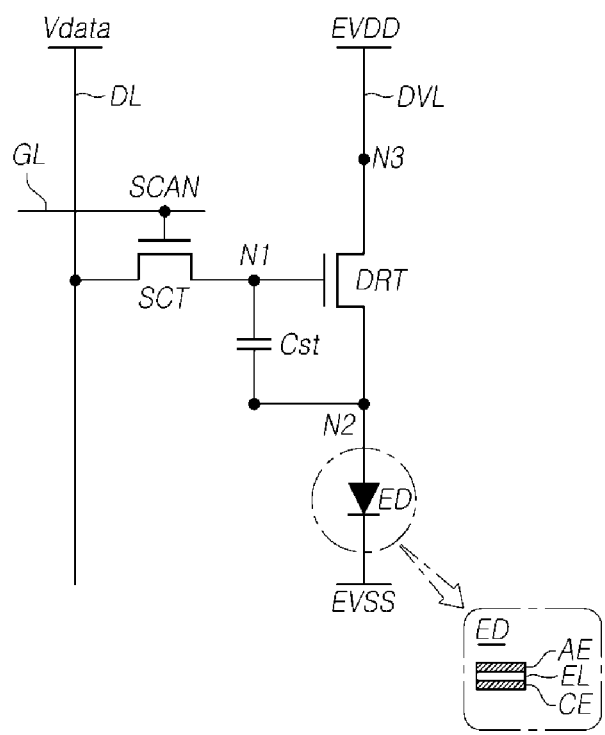
FIG. 2 is an equivalent circuit diagram illustrating a subpixel of a display device according to embodiments of the disclosure.
Figure 3:
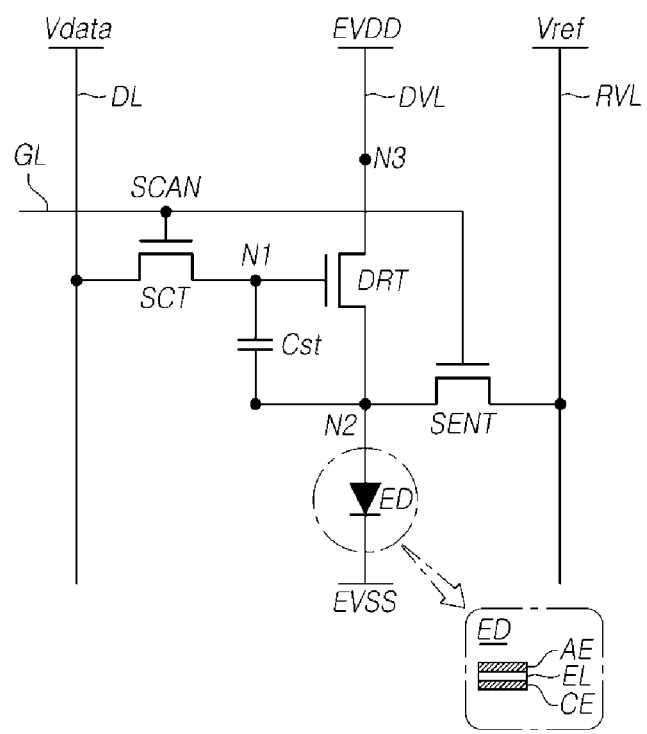
FIG. 3 is another equivalent circuit diagram illustrating a subpixel of a display device according to embodiments of the disclosure.

FIG. 2 illustrates an equivalent circuit of a subpixel SP of a display device 100 according to embodiments of the disclosure, and FIG. 3 illustrates another equivalent circuit of a subpixel SP of the display device 100 according to embodiments of the disclosure.

Referring to FIG. 2, in a display device 100 according to embodiments of the disclosure, each subpixel SP may include a light emitting element ED, a driving transistor DRT for controlling the current flowing to the light emitting element ED to drive the light emitting element ED, a scan transistor SCT for transferring a data voltage Vdata to a first node N1 which is the gate node of the driving transistor DRT, and a storage capacitor for maintaining the voltage during a predetermined period.

The light emitting element ED may include an anode electrode AE and a cathode electrode CE, and a light emitting layer EL positioned between the anode electrode AE and the cathode electrode CE. The anode electrode AE of the light emitting element ED may be a pixel electrode. The cathode electrode CE may be a common electrode. The light emitting element ED may be, e.g., an organic light emitting diode OLED, an inorganic material-based light emitting diode LED, or a quantum dot light emitting element.

A cathode voltage EVSS corresponding to a base voltage may be applied to the cathode electrode CE of the light emitting element ED. The cathode voltage EVSS may be, e.g., a ground voltage or a voltage similar to the ground voltage.

The driving transistor DRT is a transistor for driving the light emitting element ED, and may include a first node N1, a second node N2, and a third node N3.

The first node N1 of the driving transistor DRT is a node corresponding to the gate node and may be electrically connected with the source node or drain node of the scan transistor SCT. The second node N2 of the driving transistor DRT is a source node or a drain node, and may be electrically connected to the anode electrode AE of the light emitting element ED. The third node N3 of the driving transistor DRT may be a drain node or a source node, and may be electrically connected to a driving voltage line DVL that supplies the driving voltage EVDD. Hereinafter, for convenience of description, in the example described below, the second node N2 of the driving transistor DRT may be a source node and the third node N3 may be a drain node.

The scan transistor SCT may switch the connection between the data line DL and the first node N1 of the driving transistor DRT.

The scan transistor SCT responds to the scan signal SCAN supplied from the gate line GL and may control the connection between the first node N1 of the driving transistor DRT and a corresponding data line DL of the plurality of data lines DL.

The drain node or source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the gate line GL to receive the scan signal SCAN.

The scan transistor SCT may be turned on by the scan signal SCAN of a turn-on level voltage and transfer the data voltage Vdata supplied from the data line DL to the first node N1 of the driving transistor DRT.

The scan transistor SCT is turned on by the scan signal SCAN of the turn-on level voltage and turned off by the scan signal SCAN of a turn-off level voltage. When the scan transistor SCT is of the n type, the turn-on level voltage may be a high level voltage, and the turn-off level voltage may be a low level voltage that is less than the high level voltage. When the scan transistor SCT is of the p type, the turn-on level voltage may be a low level voltage, and the turn-off level voltage may be a high level voltage that is greater than the low level voltage.

The storage capacitor Cst may be electrically connected between the first node N1 and the second node N2 of the driving transistor DRT to maintain the data voltage Vdata corresponding to the image signal voltage or a voltage corresponding thereto during one frame time.

The storage capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

Since the subpixel SP illustrated in FIG. 2 has two transistors DRT and SCT and one capacitor Cst to drive the light emitting element ED, the subpixel SP is referred to as having a 2T (transistor) 1C (capacitor) structure.

Referring to FIG. 3, in the display device 100 according to embodiments of the disclosure, each subpixel SP may further include a sensing transistor SENT for an initialization operation and a sensing operation.

In this case, since the subpixel SP illustrated in FIG. 3 has three transistors DRT, SCT, and SENT and one capacitor Cst to drive the light emitting element ED, the subpixel SP is referred to as having a 3T (transistor) 1C (capacitor) structure.

The sensing transistor SENT may switch the connection between the second node N2 of the driving transistor DRT and the reference voltage line RVL.

The sensing transistor SENT may control the connection between the second node N2 of the driving transistor DRT electrically connected to the anode electrode AE of the light emitting element ED and a corresponding reference voltage line RVL among the plurality of reference voltage lines RVL in response to the scan signal SCAN supplied from the gate line GL.

The drain node or source node of the sensing transistor SENT may be electrically connected to the reference voltage line RVL. The source node or drain node of the sensing transistor SENT may be electrically connected to the second node N2 of the driving transistor DRT and may be electrically connected to the anode electrode AE of the light emitting element ED. The gate node of the sensing transistor SENT may be electrically connected to the gate line GL to receive the scan signal SCAN.

The sensing transistor SENT may be turned on, applying the reference voltage Vref supplied from the reference voltage line RVL to the second node N2 of the driving transistor DRT.

The sensing transistor SENT is turned on by the scan signal SCAN of the turn-on level voltage and turned off by the scan signal SCAN of a turn-off level voltage. When the sensing transistor SENT is of the n type, the turn-on level voltage may be a high level voltage, and the turn-off level voltage may be a low level voltage that is less than the high level voltage. When the sensing transistor SENT is of the p type, the turn-on level voltage may be a low level voltage, and the turn-off level voltage may be a high level voltage that is greater than the low level voltage.

Each of the driving transistor DRT, the scan transistor SCT, and the sensing transistor SENT may be an n-type transistor or a p-type transistor. All of the driving transistor DRT, the scan transistor SCT, and the sensing transistor SENT may be n-type transistors or p-type transistors. At least one of the driving transistor DRT, the scan transistor SCT, and the sensing transistor SENT may be an n-type transistor (or a p-type transistor), and the others may be p-type transistors (or n-type transistors).

As illustrated in FIG. 3, the respective gate nodes of the scan transistor SCT and the sensing transistor SENT may be connected to the same gate line GL. Alternatively, the respective gate nodes of the scan transistor SCT and the sensing transistor SENT may be connected to different gate lines GL.

The reference voltage line RVL may be disposed for each subpixel column. Alternatively, the reference voltage line RVL may be disposed every two or more subpixel columns. When the reference voltage line RVL is disposed every two or more subpixel columns, the plurality of subpixels SP may receive the reference voltage Vref from one reference voltage line RVL. For example, one reference voltage line RVL may be disposed every four subpixel columns. In other words, one reference voltage line RVL may be shared by the subpixels SP included in the four subpixel columns.

The driving voltage line DVL may be disposed for each subpixel column. Alternatively, the driving voltage line DVL may be disposed every two or more subpixel columns. When the driving voltage line DVL is disposed every two or more subpixel columns, the plurality of subpixels SP may receive the driving voltage EVDD from one driving voltage line DVL. For example, one driving voltage line DVL may be disposed every four subpixel columns. In other words, one driving voltage line DVL may be shared by the subpixels SP included in the four subpixel columns.

The 3T1C structure of the subpixel SP illustrated in FIG. 3 is merely an example for description, and may further include one or more transistors or, in some cases, one or more storage capacitors. The plurality of subpixels SP may have the same structure, or some of the plurality of subpixels SP may have a different structure.

The display device 100 according to embodiments of the disclosure may have a top emission structure or a bottom emission structure.

Figure 4:
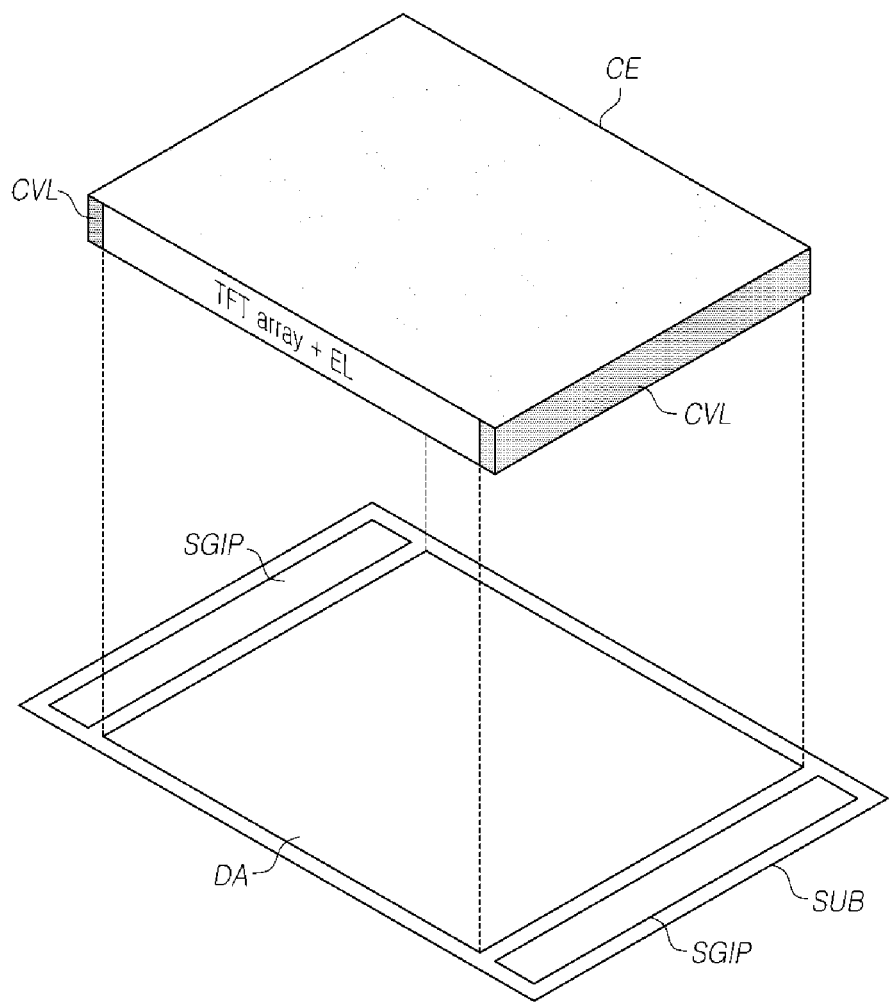
FIG. 4 is a view illustrating a cathode structure of a display device according to embodiments of the disclosure.

FIG. 4 is a view illustrating a cathode structure of a display device 100 according to embodiments of the disclosure.

Referring to FIG. 4, a cathode electrode may be disposed on the substrate SUB of the display panel 110 to form the light emitting elements ED in the plurality of subpixels SP in the display area DA of the display panel 110.

The cathode electrode CE may be one large bulk-type electrode.

A thin film transistor array TFT array including a plurality of transistors (DRT, SCT, etc.) included in a plurality of subpixels SP in the display area DA may be disposed on the substrate SUB. The anode electrode AE and light emitting layer EL for each of the plurality of subpixels SP may be disposed on the thin film transistor array TFT Array.

A cathode electrode CE may be disposed on the light emitting layer EL of each of the plurality of subpixels SP.

As described above, the gate driving circuit 130 may be configured in a gate in panel (GIP) type. In this case, the gate driving circuit 130 may include a plurality of scan driving circuits SGIP configured in a GIP type.

The plurality of scan driving circuits SGIP may be disposed on the substrate SUB, and may respectively correspond to the plurality of gate lines GL.

For example, the plurality of scan driving circuits SGIP may be disposed in the non-display area NDA that is an outer area of the display area DA.

As another example, the plurality of scan driving circuits SGIP may be disposed in the display area DA. In this case, the plurality of scan driving circuits SGIP may overlap the plurality of subpixels SP and may be positioned under the thin film transistor array TFT Array.

Referring to FIG. 4, the display panel 110 of the display device 100 according to embodiments of the disclosure may further include a cathode voltage line CVL for supplying the cathode voltage EVSS to the cathode electrode CE.

Figure 5:
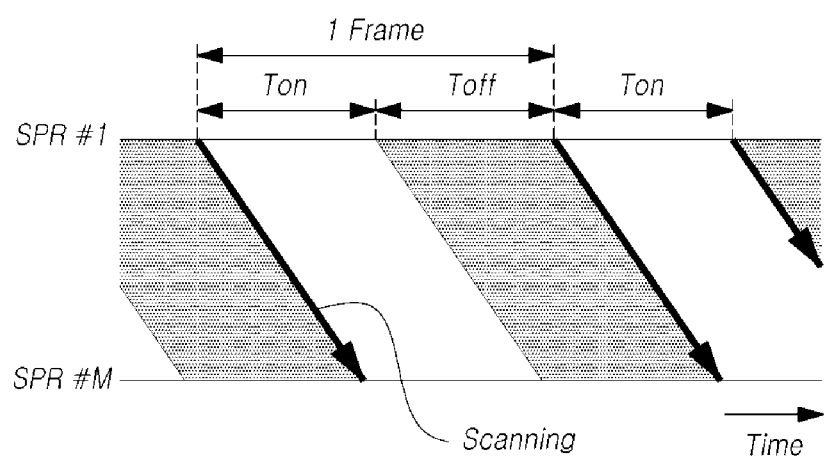
FIG. 5 is a diagram illustrating an operation of a display device according to embodiments of the disclosure.

FIG. 5 is a diagram illustrating an operation of a display device 100 according to embodiments of the disclosure.

In the diagram of FIG. 5, the y axis denotes a plurality of subpixel rows SPR #1 to SPR #M in the display panel 110, and the x-axis represents the time.

Referring to FIG. 5, the display device 100 according to embodiments of the disclosure may perform driving to prevent or at least reduce motion blur. The anti-motion blur driving may be a driving to make a screen state different from the actual image screen between actual images. For example, anti-motion blur driving may be driving such that a black screen or a low grayscale screen is displayed between actual images.

Referring to FIG. 5, according to anti-motion blur driving, a display stop driving period Toff for stopping the display driving for displaying the actual image may proceed between the display driving periods Ton during which the display driving for displaying the actual image is performed.

During one frame time of each of the plurality of subpixels SP, a display driving period Ton and a display stop driving period Toff may proceed.

Scanning of each of the plurality of subpixel rows SPR #1 to SPR #M may be sequentially started, so that display driving for each of the plurality of subpixel rows SPR #1 to SPR #M may be sequentially performed. Accordingly, a real image may be displayed in each area of the plurality of subpixel rows SPR #1 to SPR #M.

The display stop driving period Toff for each of the plurality of subpixel rows SPR #1 to SPR #M may be sequentially started, so that display stop driving for each of the plurality of subpixel rows SPR #1 to SPR #M may be performed sequentially. Accordingly, a fake image different from the actual image may be displayed in the area of each of the plurality of subpixel rows SPR #1 to SPR #M.

For example, since the actual image itself is not displayed on the screen, the screen may be shown, in black or low grayscale, to the user. The screen being shown in black or low gradation may be regarded as a fake image.

As described above, as anti-motion blur driving is performed, it is possible to prevent or reduce motion blur which causes moving objects to appear blurry due to the persistence of an afterimage or data of the previous image.

Accordingly, the display device 100 according to embodiments of the disclosure may perform anti-motion blur driving in a simple scheme, and there may be provided a cathode patterning structure (also called a split cathode structure) and a cathode driving system suitable for straightforward anti-motion blur driving.

A cathode patterning structure and a cathode driving system of the display device 100 according to embodiments of the disclosure and straightforward anti-motion blur driving are described below.

Figure 6:
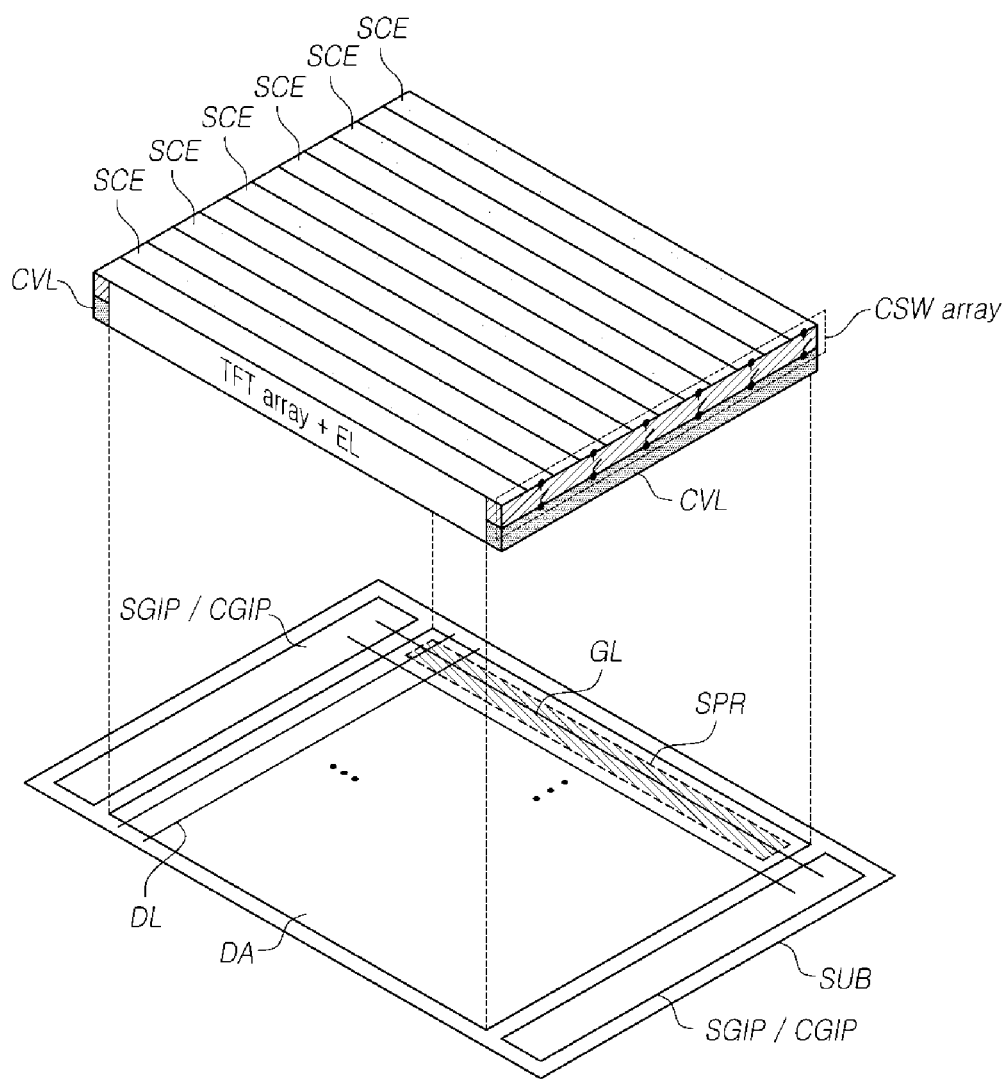
FIG. 6 illustrates a cathode patterning structure of a display device according to embodiments of the disclosure.
Figure 7:
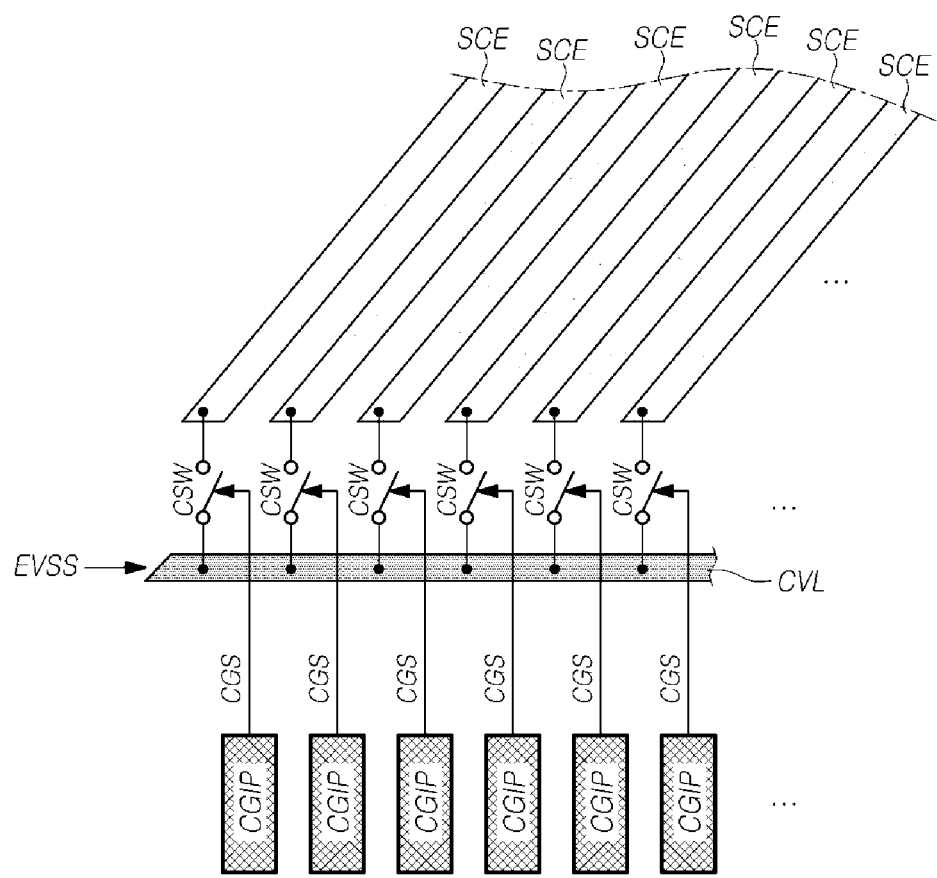
FIG. 7 illustrates a cathode driving system for driving multiple split cathode electrodes in a display device according to embodiments of the disclosure.
Figure 8:
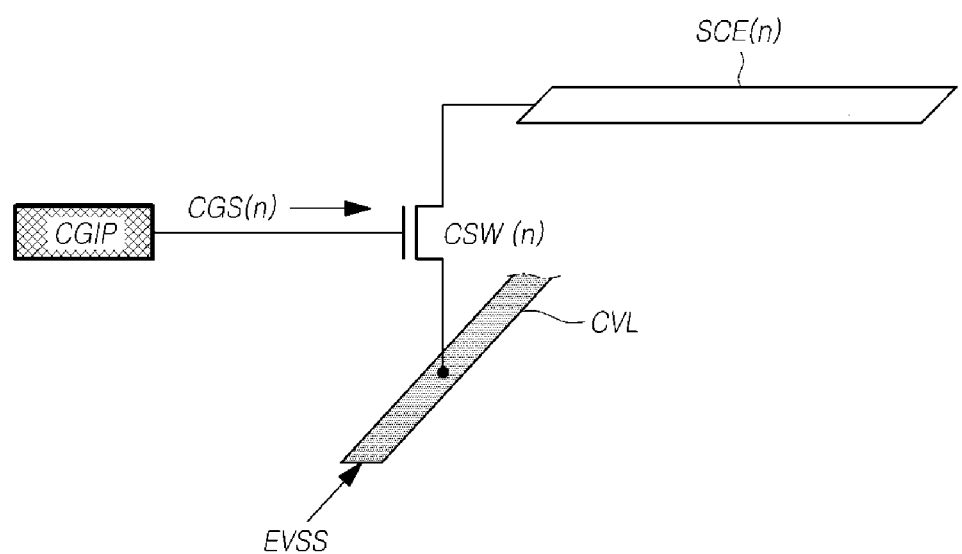
FIG. 8 is a diagram illustrating timings for driving a split cathode electrode in a display device according to embodiments of the disclosure.
Figure 8:
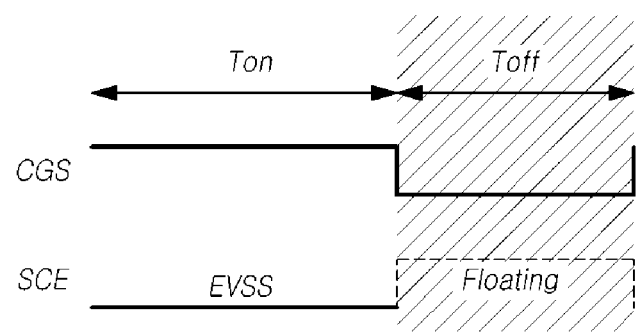

FIG. 6 illustrates a cathode patterning structure of a display device 100 according to embodiments of the disclosure. FIG. 7 illustrates a cathode driving system for driving multiple split cathode electrodes SCE in a display device 100 according to embodiments of the disclosure. FIG. 8 is a diagram illustrating timings for driving a split cathode electrode SCE in a display device 100 according to embodiments of the disclosure.

Referring to FIG. 6, the display device 100 according to embodiments of the disclosure may include a plurality of split cathode electrodes SCE, rather than a single bulk-type cathode electrode CE, to form the light emitting elements EP.

Referring to FIG. 6, a cathode structure composed of a plurality of split cathode electrodes (SCE) is referred to as a cathode patterning structure or a split cathode structure.

Referring to FIG. 6, by having the cathode patterning structure, the display device 100 according to embodiments of the disclosure may include a substrate SUB, a thin film transistor array including a plurality of driving transistors DRT on the substrate SUB, a plurality of anode electrodes AE connected to the plurality of driving transistors DRT, a light emitting layer EL on the plurality of anode electrodes AE, and a plurality of split cathode electrodes SCE on the light emitting layer EL.

As described above, the display device 100 according to embodiments of the disclosure may further include a plurality of gate lines GL and a plurality of data lines DL crossing each other.

Referring to FIG. 6, in the display device 100 according to embodiments of the disclosure, each of the plurality of split cathode electrodes SCE may correspond to one or more subpixel rows (SP Row) SPR. In other words, each split cathode electrode SCE may overlap one or more subpixel rows SPR.

In the display device 100 according to embodiments of the disclosure, each of the plurality of split cathode electrodes SCE may be disposed in a direction crossing the plurality of data lines DL.

In the display device 100 according to embodiments of the disclosure, each of the plurality of split cathode electrodes SCE may be disposed in a direction parallel to the plurality of gate lines GL.

Referring to FIGS. 6 and 8, the display device 100 according to embodiments of the disclosure may perform anti-motion blur driving in such a manner as to control the electrical state (also referred to as a voltage state) of each of the plurality of split cathode electrodes (SCE).

Referring to FIGS. 6 to 8, in the display device 100 according to embodiments of the disclosure, each of the plurality of split cathode electrodes SCE may be not in an electrical state in which the cathode voltage EVSS is always applied, but in a first state in which the cathode voltage EVSS is applied at an arbitrary first time and is not applied at a second time different from the first time.

For example, in the display device 100 according to embodiments of the disclosure, each of the plurality of split cathode electrodes SCE may have the first state, in which the cathode voltage EVSS is applied, and the second state, in which it is floated without application of the cathode voltage EVSS, alternated.

The display device 100 according to embodiments of the disclosure may perform anti-motion blur driving by controlling to change the electrical state (voltage state) of each of the plurality of split cathode electrodes SCE depending on the driving time or driving context.

Referring to FIGS. 6 to 8, the display device 100 according to embodiments of the disclosure may independently control the electrical state (voltage state) of each of the plurality of split cathode electrodes (SCE) when controlling the electrical state (voltage state) of each of the plurality of split cathode electrodes (SCE). In other words, in the display device 100 according to embodiments of the disclosure, the electrical state (voltage state) of each of the plurality of split cathode electrodes (SCE) may be independently controlled.

Accordingly, in the display device 100 according to embodiments of the disclosure, at least one of the plurality of split cathode electrodes SCE may have a different electrical state (voltage state) from the rest.

More specifically, at an arbitrary time, the electrical state (voltage state) of any one of the plurality of split cathode electrodes (SCE) and the electrical state (voltage state) of another split cathode electrode (SCE) may be different from each other.

For example, among the plurality of split cathode electrodes (SCE), at least one may be in the first state in which the cathode voltage EVSS is applied, and the rest (remaining split cathode electrodes) may be in the second state in which it is floated without application of the cathode voltage EVSS.

As described above, the display device 100 according to embodiments of the disclosure may independently control the electrical state (voltage state) of each of the plurality of split cathode electrodes (SCE), performing anti-motion blur driving sequentially per area.

Referring to FIGS. 6 to 8, the display device 100 according to embodiments of the disclosure may include a cathode driving system for controlling the voltage state of each of the plurality of split cathode electrodes (SCE).

Referring to FIGS. 6 to 8, the cathode driving system may include at least one cathode voltage line CVL to which the cathode voltage EVSS is applied.

For example, the electrical state (voltage state) of each of the plurality of split cathode electrodes (SCE) may repeat a shorted state (first state) in which it is electrically connected to at least one cathode voltage line CVL and a floating state (second state) in which it is electrically separated from at least one cathode voltage line CVL.

Referring to FIGS. 6 to 8, the cathode driving system may further include a plurality of control switching elements CSW and a plurality of cathode driving circuits CGIP to control the voltage state of each of the plurality of split cathode electrodes SCE.

Referring to FIGS. 6 to 8, the plurality of control switching elements CSW may correspond to the plurality of split cathode electrodes SCE, respectively, and may be elements for switching the connection between each of the plurality of split cathode electrodes SCE and at least one cathode voltage line CVL.

In other words, one control switching element CSW may electrically connect one corresponding split cathode electrode SCE to at least one cathode voltage line CVL or electrically separate the split cathode electrode SCE from at least one cathode voltage line CVL. The cathode voltage EVSS may be applied to the at least one cathode voltage line CVL.

Referring to FIGS. 6 to 8, the plurality of cathode driving circuits CGIP may correspond to the plurality of control switching elements CSW, respectively. The plurality of cathode driving circuits CGIP may control on-off of each of the plurality of control switching elements CSW.

The plurality of cathode driving circuits CGIP may output the plurality of control gate signals CGS to the plurality of control switching elements CSW, respectively. The plurality of control gate signals CGS may be signals for controlling on/off of each of the plurality of control switching elements CSW.

Referring to FIGS. 6 to 8, in the display device 100 according to embodiments of the disclosure, the plurality of cathode driving circuits CGIP may output a plurality of control gate signals CGS having independent signal waveforms to the plurality of control switching elements CSW, independently controlling on/off of each of the plurality of control switching elements CSW.

Accordingly, the electrical state (voltage state) of each of the plurality of split cathode electrodes SCE may be independently controlled.

A method for controlling the voltage state of the split cathode electrode SCE is described with reference to FIG. 8.

Referring to FIG. 8, the nth control switching elements CSW(n) may control the connection between the cathode voltage line CVL and the nth split cathode electrode SCE(n).

Referring to FIG. 8, the nth cathode driving circuit CGIP may output the control gate signal CGS(n) to the nth control switching element CSW(n).

During the display driving period Ton, the control gate signal CGS(n) may have a turn-on level voltage. During the display stop driving period Toff, the control gate signal CGS(n) may have a turn-off level voltage.

As in the example of FIG. 8, when the control switching element CSW is an n-type transistor, the turn-on level voltage of the control gate signal CGS(n) may be a high level voltage, and the turn-off level voltage of the control gate signal CGS(n) may be a low level voltage.

When the control switching element CSW is a p-type transistor, the turn-on level voltage of the control gate signal CGS(n) may be a low level voltage, and the turn-off level voltage of the control gate signal CGS(n) may be a high level voltage.

Referring to FIG. 8, during the display driving period Ton, the nth cathode driving circuit CGIP(n) applies the control gate signal CGS(n) of the turn-on level voltage to the gate node of the nth control switching element CSW(n), so that the nth control switching element CSW(n) may be turned on.

Accordingly, the nth split cathode electrode SCE(n) and the cathode voltage line CVL may be electrically connected. Accordingly, the cathode voltage EVSS applied to the cathode voltage line CVL may be supplied to the nth split cathode electrode SCE(n) through the nth control switching element CSW(n).

Accordingly, the light emitting elements ED formed by the nth split cathode electrode SCE(n) may be in a state capable of emitting light.

Referring to FIG. 8, during the display stop driving period Toff, the nth cathode driving circuit CGIP(n) applies the control gate signal CGS(n) of the turn-off level voltage to the gate node of the nth control switching element CSW(n), so that the nth control switching element CSW(n) may be turned off.

Accordingly, the nth split cathode electrode SCE(n) and the cathode voltage line CVL may be electrically disconnected. In other words, the nth split cathode electrode SCE(n) may be in a floating state of having been electrically disconnected from the cathode voltage line CVL.

Accordingly, the cathode voltage EVSS applied to the cathode voltage line CVL is not supplied to the nth split cathode electrode SCE(n).

Accordingly, the light emitting elements ED formed by the nth split cathode electrode SCE(n) may be in a state incapable of emitting light.

Referring to FIGS. 6 and 7, the plurality of control switching elements CSW and the plurality of cathode driving circuits CGIP may be disposed on the substrate SUB and be positioned in the non-display area NDA.

Referring to FIGS. 6 and 7, each of the plurality of split cathode electrodes SCE may be disposed in a direction crossing the plurality of data lines DL, and at least one cathode voltage line CVL may be disposed in a direction crossing the plurality of gate lines GL.

Each of the plurality of subpixels SP included in the display device 100 according to embodiments of the disclosure may include a light emitting element ED, a driving transistor DRT for driving the light emitting element ED, a scan transistor SCT that switches the connection between the first node N1 of the driving transistor DRT and the data line DL, a sensing transistor SENT that switches the connection between the second node N2 of the driving transistor DRT and the reference voltage line RVL, and a storage capacitor Cst connected between the first node N1 and the second node N1.

The light emitting element ED in each subpixel SP may include one anode electrode AE of a plurality of anode electrodes AE, a light emitting layer EL, and one split cathode electrode SCE of a plurality of split cathode electrodes SCE.

Referring to FIGS. 6 to 8, when the display device 100 according to embodiments of the disclosure is in the display driving period Ton, at least one split cathode electrode SCE among the plurality of split cathode electrodes SCE may be in a shorted state (first state) of having been electrically connected with at least one cathode voltage line CVL.

At least one subpixel row SPR overlapping the at least one split cathode electrode SCE may emit light while the at least one split cathode electrode SCE is in the shorted state (first state) of being electrically connected to the at least one cathode voltage line CVL.

Referring to FIGS. 6 to 8, in the display device 100 according to embodiments of the disclosure, at least one subpixel row SPR overlapping at least one split cathode electrode SCE may not emit light in a floating state (the second state) in which at least one split cathode electrode SCE among the plurality of split cathode electrodes SCE is electrically separated from at least one cathode voltage line CVL.

As described above, the display device 100 according to embodiments of the disclosure may alternately perform the display driving period Ton and the display stop driving period Toff on each of one or more subpixel rows as anti-motion blur driving is performed.

One or more subpixel rows SPR where the display stop driving period Toff simultaneously proceeds may correspond to at least one split cathode electrode SCE among the plurality of split cathode electrodes SCE.

At least one split cathode electrode SCE corresponding to one or more subpixel rows SPR where the display stop driving period Toff simultaneously proceeds may be floated from at least one cathode voltage line CVL.

The area of one or more subpixel rows SPR where the display stop driving period Toff is simultaneously performed may appear in black or low grayscale.

At least one split cathode electrode SCE of the plurality of split cathode electrodes SCE may be in the second state (floating state) of being electrically disconnected from the cathode voltage line CVL.

The subpixels including the anode electrodes AE overlapping at least one split cathode electrode SCE in the second state (floating state) may not emit light.

Figure 9A:
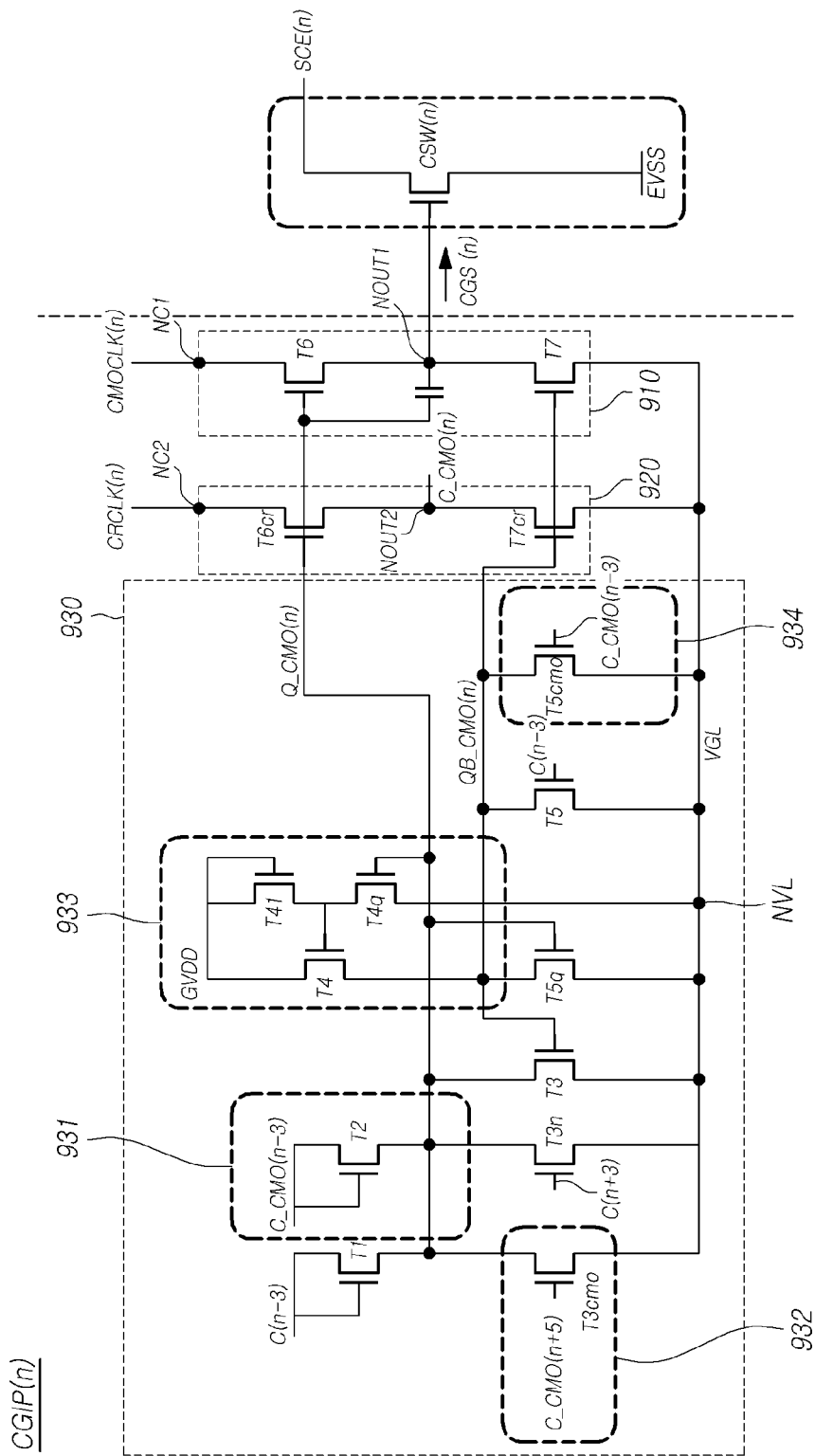
FIG. 9A exemplarily illustrates a cathode driving circuit for driving a split cathode electrode in a display device according to embodiments of the disclosure.
Figure 9B:
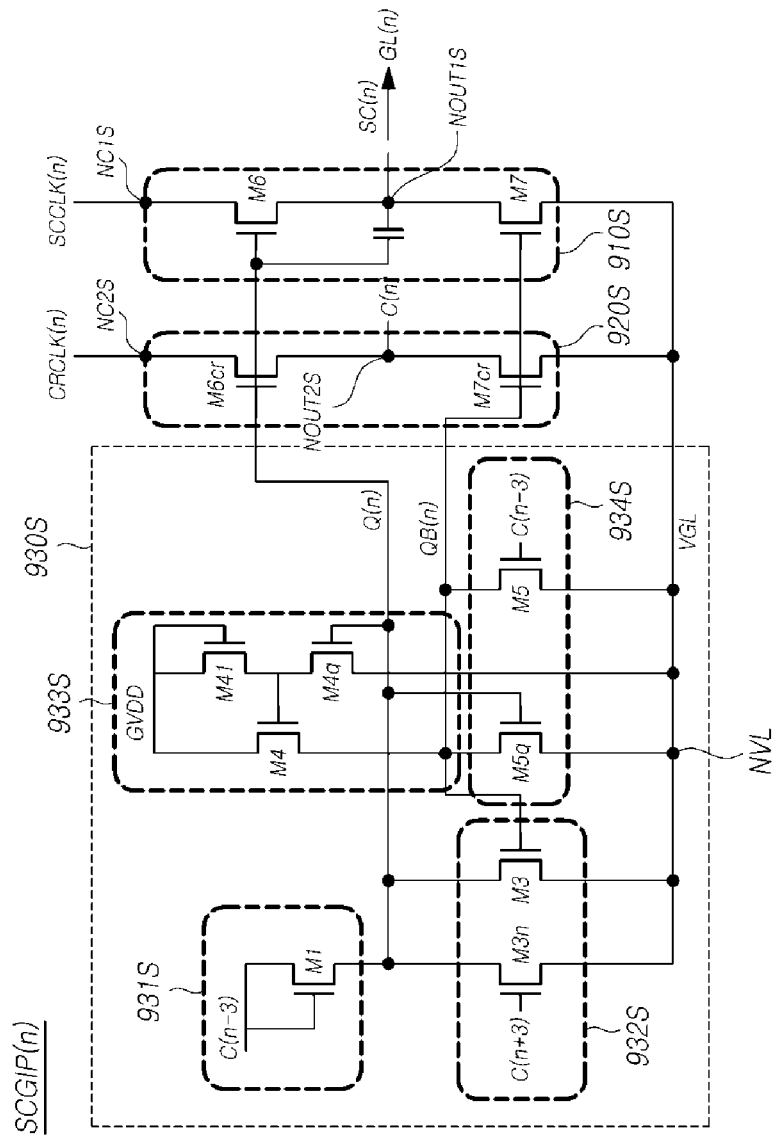
FIG. 9B illustrates a scan driving circuit of a display device according to embodiments of the disclosure.
Figure 10:
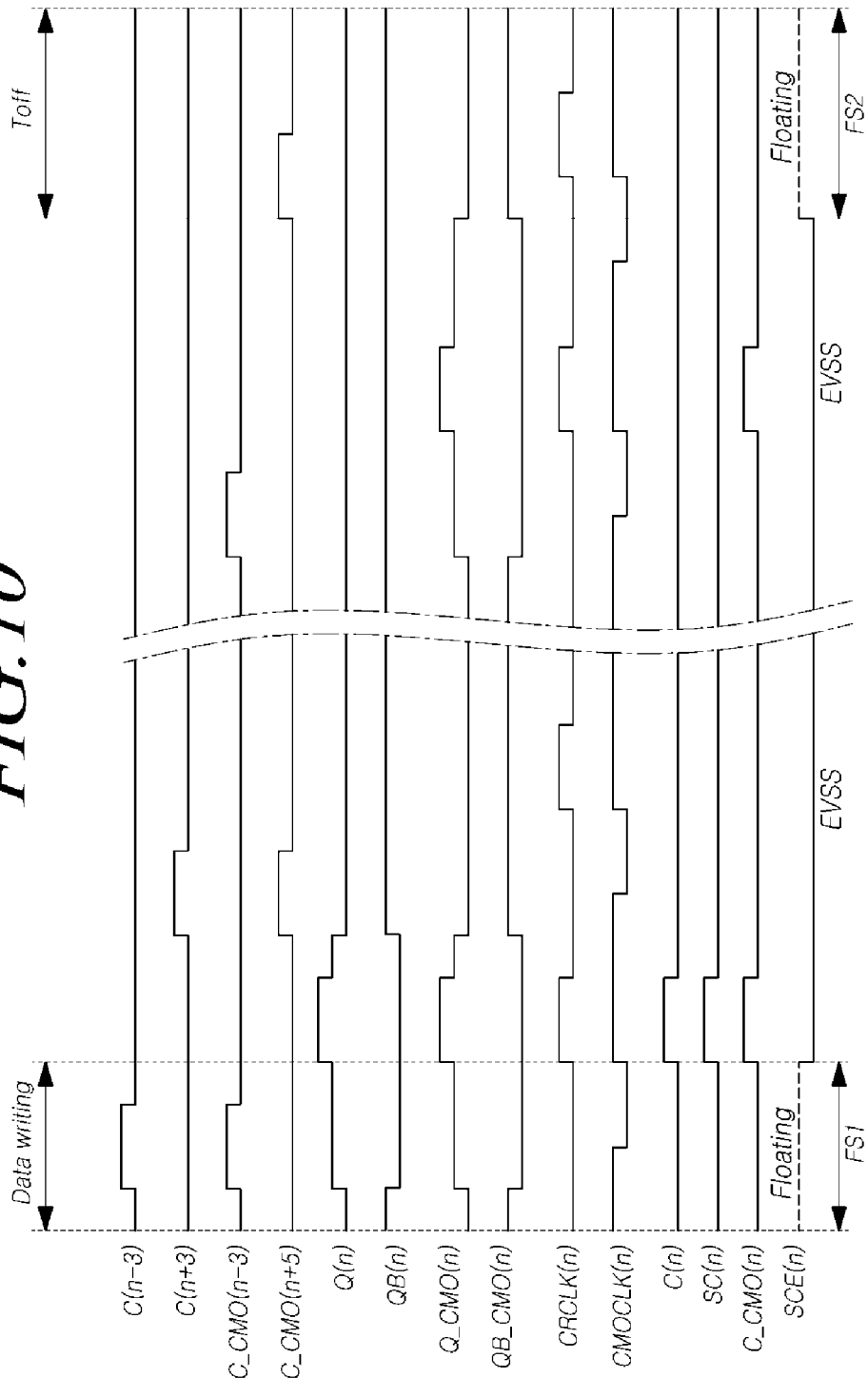
FIG. 10 is a driving timing diagram of the cathode driving circuit of FIG. 9A and the scan driving circuit of FIG. 9B according to embodiments of the disclosure.

FIG. 9A exemplarily illustrates a cathode driving circuit CGIP(n) for driving a split cathode electrode SCE(n) in a display device according to embodiments of the disclosure. FIG. 9B exemplarily illustrates a second driving circuit SGIP(n) in a display device 100 according to embodiments of the disclosure. FIG. 10 is a driving timing diagram of the cathode driving circuit CGIP(n) of FIG. 9A and the second driving circuit SGIP(n) of FIG. 9B.

The nth cathode driving circuit CGIP(n) of FIG. 9A is another implementation example of the nth cathode driving circuit CGIP(n) of FIG. 8.

Referring to FIG. 9A, the nth cathode driving circuits CGIP(n) may generate a control gate signal CGS(n) and may output the generated control gate signal CGS(n) to the gate node of the nth control switching element CSW(n).

Referring to FIG. 9A, the nth cathode driving circuit CGIP(n) may include a first output buffer unit 910 that generates and outputs a control gate signal CGS(n), a second output buffer unit 920 that generates and outputs a carry signal C_CMO(n), and a controller 930 for controlling the first output buffer unit 910 and the second output buffer unit 920.

Referring to FIG. 9A, the first output buffer unit 910 may include a first pull-up transistor T6 and a first pull-down transistor T7.

The first pull-up transistor T6 may switch the connection between the first clock node NC1 to which the first clock signal CMOCLK(n) is input and the first output node NOUT1. A capacitor may be connected between the gate node of the first pull-up transistor T6 and the first output node NOUT1.

The first pull-down transistor T7 may switch the connection between the low-level voltage node NVL to which the low-level gate voltage VGL is input and the first output node NOUT1.

Referring to FIGS. 9A and 10, the first pull-up transistor T6 and the first pull-down transistor T7 may be alternately turned on. Accordingly, the nth control gate signal CGS(n) may be generated based on the first clock signal CMOCLK(n) and the low-level gate voltage VGL and be output to the first output node NOUT1.

Referring to FIG. 9A, the second output buffer unit 920 may include a second pull-up transistor T6*cr* and a second pull-down transistor T7*cr*.

The second pull-up transistor T6*cr* may switch the connection between the second clock node NC2 to which the second clock signal CRCLK(n) is input and the second output node NOUT2.

The second pull-down transistor T7*cr* may switch the connection between the low level voltage node NVL to which the low level gate voltage VGL is input and the second output node NOUT2.

Referring to FIGS. 9A and 10, the second pull-up transistor T6*cr* and the second pull-down transistor T7*cr* may be alternately turned on. Accordingly, an nth carry signal C_CMO(n) may be generated based on the second clock signal CRCLK(n) and the low-level gate voltage VGL and be output to the second output node NOUT2.

Referring to FIG. 9A, the gate node of the first pull-up transistor T6 and the gate node of the second pull-up transistor T6*cr* may be electrically connected. Accordingly, the first pull-up transistor T6 and the second pull-up transistor T6*cr* may be simultaneously turned on or turned off.

Referring to FIG. 9A, the gate node of the first pull-down transistor T7 and the gate node of the second pull-down transistor T7*cr* may be electrically connected. Accordingly, the first pull-down transistor T7 and the second pull-down transistor T7*cr* may be simultaneously turned on or turned off.

Referring to FIG. 9A, the node to which the gate node of the first pull-up transistor T6 and the gate node of the second pull-up transistor T6*cr* are simultaneously connected may be referred to as a Q node Q_CMO(n), and the node to which the gate node of the first pull-down transistor T7 and the gate node of the second pull-down transistor T7*cr* are simultaneously connected may be referred to as a QB node QB_CMO(n).

Referring to FIG. 9A, the controller 930 controls the Q node Q_CMO(n) and the QB node QB_CMO(n) to control the first output buffer unit 910 and the second output buffer unit 920.

Referring to FIGS. 9A and 10, the voltage state of the Q node Q_CMO(n) and the voltage state of the QB node QB_CMO(n) may be opposite to each other. If the voltage state of the Q node Q_CMO(n) is a high level voltage state, the voltage state of the QB node QB_CMO(n) may be a low level voltage state. If the voltage state of the Q node Q_CMO(n) is a low level voltage state, the voltage state of the QB node QB_CMO(n) may be a high level voltage state.

Referring to FIG. 9A, the controller 930 may include a first charging unit 931 for charging the Q node Q_CMO(n), a first discharging unit 932 for discharging the Q node Q_CMO(n), a second charging unit 933 for charging the QB node QB_CMO(n), and a second discharging unit 934 for discharging the QB node QB_CMO(n).

The first charging unit 931 may include a first charging transistor T2 connected between the node to which the (n−3)th carry signal C_CMO(n−3) of the (n−3)th cathode driving circuit CGIP(n−3) is input and the Q node Q_CMO(n). The first charging transistor T2 may be controlled to be turned on or off by the (n−3)th carry signal C_CMO(n−3) of the (n−3)th cathode driving circuit CGIP(n−3). The first charging transistor T2 may be in a diode-connection state.

The first discharge unit 932 may be controlled to be turned on/off by the (n+5)th carry signal C_CMO(n+5) of the (n+5)th cathode driving circuit CGIP(n+5), and may include a first discharging transistor T3*cmo* connected between the low level voltage node NVL and the Q node Q_CMO(n).

The second charging unit 933 may include a second charging transistor T4 connected between the node to which the gate driving voltage GVDD is input and the QB node QB_CMO(n).

The second charging unit 933 may further include a first control transistor T41 and a second control transistor T4*q*.

The first control transistor T41 may be controlled to be turned on/off by the gate driving voltage GVDD and be connected between the node to which the gate driving voltage GVDD is input and the gate node of the second charging transistor T4.

The second control transistor T4*q* may be controlled to be turned on/off by the voltage of the Q node Q_CMO(n) and be connected between the gate node of the second charging transistor T4 and the low level voltage node NVL.

The second discharge unit 934 may be controlled to be turned on/off by the (n−3)th carry signal C_CMO(n−3) of the (n−3)th cathode driving circuit CGIP(n−3), and may include a second discharging transistor T5*cmo* connected between the low level voltage node NVL and the QB node QB_CMO(n).

Referring to FIG. 9A, in the controller 930, the additional transistors T1, T3*n*, T3, T5, and T5*q* which are not included in the first charging unit 931, the first discharging unit 932, the second charging unit 933, and the second discharging unit 934 may be transistors capable of controlling each of the Q node Q_CMO(n) and the QB node QB_CMO(n). For example, the additional transistor T1 may also be included in the first charging unit 931 for charging the Q node Q_CMO(n). The additional transistors T3 and T3*n* may also be included in the first discharging unit 932 for discharging the Q node Q_CMO(n). The additional transistors T5*q* and T5 may also be included in the second discharging unit 934 for discharging the QB node QB_CMO(n). Further, in the controller 930, the additional transistors T1, T3*n*, T3, T5, and T5*q*, not included in the first charging unit 931, the first discharging unit 932, the second charging unit 933, and the second discharging unit 934 may be transistors commonly included in the scan driving circuit SGIP.

Referring to FIG. 9B, the nth second driving circuit SGIP(n) may include a third output buffer unit 910S for generating and outputting a scan signal SC(n), a fourth output buffer unit 920S for generating and outputting a scan carry signal C(n), and a scan output controller 930S for controlling the third output buffer unit 910S and the fourth output buffer unit 920S.

The third output buffer unit 910S may include a third pull-up transistor M6 and a third pull-down transistor M7.

The third pull-up transistor M6 may switch connection between the third clock node NC1S to which a third clock signal SCCLK(n) is input and a third output node NOUT1S. A capacitor may be connected between the gate node of the third pull-up transistor M6 and the third output node NOUT1S. The gate node of the third pull-up transistor M6 corresponds to the Q node Q(n).

The third pull-down transistor M7 may switch connection between a low level voltage node NVL to which a low level gate voltage VGL is input and the third output node NOUT1S. The gate node of the third pull-down transistor M7 corresponds to the QB node QB(n).

Referring to FIGS. 9B and 10, the voltage level of the Q node Q(n) and the voltage level of the QB node QB(n) may be opposite to each other. Accordingly, the third pull-up transistor M6 and the third pull-down transistor M7 may be alternately turned on. Therefore, the nth scan signal SC(n) may be generated and output to the third output node NOUT1S based on the third clock signal SCCLK(n) and the low level gate voltage VGL.

Referring to FIG. 9B, the fourth output buffer unit 920S may include a fourth pull-up transistor M6cr and a fourth pull-down transistor M7cr.

The fourth pull-up transistor M6cr may switch connection between the second clock node NC2S to which the fourth clock signal CRCLK(n) is input and the fourth output node NOUT2S. The gate node of the fourth pull-up transistor M6cr corresponds to the Q node Q(n).

The fourth pull-down transistor M7cr may switch connection between the low level voltage node NVL to which the low level gate voltage VGL is input and the fourth output node NOUT2S. The gate node of the fourth pull-down transistor M7cr corresponds to the QB node QB(n).

Referring to FIGS. 9B and 10, the voltage level of the Q node Q(n) and the voltage level of the QB node QB(n) may be opposite to each other. Accordingly, the fourth pull-up transistor M6cr and the fourth pull-down transistor M7cr may be alternately turned on. Therefore, the nth scan carry signal C(n) may be generated and output to the fourth output node NOUT2S based on the fourth clock signal CRCLK(n) and the low level gate voltage VGL.

Referring to FIG. 9B, the gate node of the third pull-up transistor M6 and the gate node of the fourth pull-up transistor M6cr may be electrically connected to each other. Accordingly, the third pull-up transistor M6 and the fourth pull-up transistor M6cr may be simultaneously turned on or off.

Referring to FIG. 9B, the gate node of the third pull-down transistor M7 and the gate node of the fourth pull-down transistor M7cr may be electrically connected to each other. Accordingly, the third pull-down transistor M7 and the fourth pull-down transistor M7cr may be simultaneously turned on or off.

Referring to FIG. 9B, the node where the gate node of the third pull-up transistor M6 and the gate node of the fourth pull-up transistor M6cr are commonly connected may be regarded as the Q node Q(n), and the node where the gate node of the third pull-down transistor M7 and the gate node of the fourth pull-down transistor M7cr are commonly connected may be regarded as the QB node QB(n).

Referring to FIG. 9B, the scan output controller 930 may control the Q node Q(n) and the QB node QB(n) to control the third output buffer unit 910S and the fourth output buffer unit 920S. The voltage level of the Q node Q(n) and the voltage level of the QB node QB(n) may be opposite to each other.

Referring to FIG. 9B, the scan output controller 930S may include a third charging unit 931S for charging the Q node Q(n), a third discharging unit 932S for discharging the Q node Q(n), a fourth charging unit 933S for charging the QB node QB(n), and a fourth discharging unit 934S for discharging the QB node QB(n).

The third charging unit 931S may include a third charging transistor M1 for charging the Q node Q(n).

The third charging transistor M1 may control connection between the node to which the (n−3)th scan carry signal C(n−3) is input and the Q node Q(n) according to the (n−3)th scan carry signal C(n−3). The third charging transistor M1 may be in a diode-connected state, and the (n−3)th scan carry signal C(n−3) may be simultaneously input to the drain node (or source node) and the gate node.

If the third charging transistor M1 is turned on by the high level voltage of the (n−3)th scan carry signal C(n−3), the high level voltage of the (n−3)th scan carry signal C(n−3) may be applied to the Q node Q(n) through the third charging transistor M1. Accordingly, the Q node Q(n) may be charged.

The third discharging unit 932S may include at least one of third discharging transistors M3n and M3.

Of the third discharging transistors M3n and M3, the third discharging transistor M3n may control connection between the Q node Q(n) and the low level voltage node NVL according to the (n+3)th scan carry signal C(n+3) applied to the gate node.

If the third discharging transistor M3n is turned on, the low level gate voltage VGL of the low level voltage node NVL may be applied to the Q node Q(n) through the third discharging transistor. Accordingly, the Q node Q(n) may be discharged.

Of the third discharging transistors M3n and M3, the third discharging transistor M3 may control connection between the Q node Q(n) and the low level voltage node NVL according to the voltage state of the QB node QB(n) connected with the gate node.

If the third discharging transistor M3 is turned on, the low level gate voltage VGL of the low level voltage node NVL may be applied to the Q node Q(n) through the third discharging transistor M3. Accordingly, the Q node Q(n) may be discharged.

The fourth charging unit 933S may include a fourth charging transistor M4 connected between the node to which the gate driving voltage GVDD is input and the QB node QB(n).

The fourth charging unit 933S may further include a first control transistor M41 and a second control transistor M4q.

The first control transistor M41 may be in a diode-connected state in which the drain node (or source node) and the gate node are electrically connected with each other, be controlled to be turned on or off by the gate driving voltage GVDD, and control connection between the node to which the gate driving voltage GVDD is input and the gate node of the fourth charging transistor M4.

The second control transistor M4q may be controlled to be turned on or off by the voltage of the Q node Q(n) and be connected between the gate node of the fourth charging transistor M4 and the low level voltage node NVL.

If the first control transistor M41 is turned on so that the gate driving voltage GVDD is applied to the gate node of the fourth charging transistor M4, the fourth charging transistor M4 may be turned on. Accordingly, the node to which the gate driving voltage GVDD is input and the QB node QB(n) may be electrically connected to each other through the turned-on fourth charging transistor M4. Therefore, the gate driving voltage GVDD may be applied to the QB node QB(n) so that the QB node QB(n) may be charged.

The fourth discharging unit 934S may include at least one of fourth discharging transistors M5 and M5q for controlling connection between the low level voltage node NVL and the QB node QB(n).

Of the fourth discharging transistors M5 and M5q, the fourth discharging transistor M5 may be controlled to be turned on or off according to the (n−3)th scan carry signal C(n−3) and control connection between the low level voltage node NVL and the QB node QB(n).

Of the fourth discharging transistors M5 and M5q, the fourth discharging transistor M5q may be controlled to be turned on or off according to the voltage state of the Q node Q(n) and control connection between the low level voltage node NVL and the QB node QB(n).

As at least one of the fourth discharging transistors M5 and M5q is turned on, the low level voltage node NVL and the QB node QB(n) may be electrically connected to each other, so that the low level gate voltage VGL may be applied to the QB node QB(n). Therefore, the QB node QB(n) may be discharged.

Referring to FIGS. 9A and 9B, the nth cathode driving circuit CGIP(n) may generate and output a control gate signal CGS(n) based on various signals, output the control gate signal CGS(n) to the gate node of the control switching element CSW(n). The nth scan driving circuit SGIP(n) may generate a scan signal SC(n) and output it to the nth gate line GL(n).

Referring to FIGS. 9A, 9B, and 10, various signals involved in the generation of the control gate signal CGS(n) and the scan signal SC(n) may include an (n−3)th scan carry signal C(n−3) of the (n−3)th scan driving circuit SGIP(n−3), an (n+3)th scan carry signal C(n+3) of the (n+3)th scan driving circuit SGIP(n+3), an (n−3)th carry signal C_CMO(n−3) of the (n−3)th cathode driving circuit CGIP(n−3), an (n+5)th carry signal C_CMO(n+5) of the (n+5)th cathode driving circuit CGIP(n+5), a voltage of the Q node Q(n) of the nth scan driving circuit SGIP(n), a voltage of the QB node QB(n) of the nth scan driving circuit SGIP(n), a voltage of the Q node Q_CMO(n) of the nth cathode driving circuit CGIP(n), a voltage of the QB node QB_CMO(n) of the nth cathode driving circuit CGIP(n), a second clock signal CRCLK(n) input to the nth cathode driving circuit CGIP(n), a first clock signal CMOCLK(n) input to the nth cathode driving circuit CGIP(n), a scan carry signal C(n) of the nth scan driving circuit SGIP(n), and an nth carry signal C_CMO(n) of the nth cathode driving circuit CGIP(n).

Referring to FIGS. 9A and 10, when the Q node Q_CMO(n) has a high level voltage so the first clock signal CMOCLK(n) has a high level voltage in the turned-on state of the first pull-up transistor T6, the high level voltage of the first clock signal CMOCLK(n) may correspond to the control gate signal CGS(n) and be output to the first output node NOUT1 through the turned-on first pull-up transistor T6.

The control switching element CSW(n) may be turned on by the control gate signal CGS(n) of the high level voltage output to the first output node NOUT1. Accordingly, the cathode voltage EVSS applied to the cathode voltage line CVL may be applied to the split cathode electrode SCE(n) through the control switching element CSW(n).

Referring to FIGS. 9A and 10, when the QB node QB_CMO(n) has a high level voltage so that the first pull-down transistor T7 is in a turned-on state, the low level gate voltage VGL may correspond to the control gate signal CGS(n) and be output to the first output node NOUT1 through the turned-on first pull-down transistor T7.

Referring to FIGS. 9A and 10, when the Q node Q_CMO(n) has a high level voltage so that the first clock signal CMOCLK(n) in the turned-on state of the first pull-up transistor T6, the low level voltage of the first clock signal CMOCLK(n) may correspond to the control gate signal CGS(n) and be output to the first output node NOUT1 through the turned-on first pull-up transistor T6.

As described above, the low level gate voltage VGL or the low level voltage of the first clock signal CMOCLK(n) may correspond to the control gate signal CGS(n) and be output to the first output node NOUT1. The control switching element CSW(n) may be turned off by the control gate signal CGS(n). Accordingly, the cathode voltage line CVL to which the cathode voltage EVSS is applied and the split cathode electrode SCE(n) may be floating.

Referring to FIG. 10, when the split cathode electrode SCE(n) is in an electrically floating state (second floating state), a display stop driving period Toff may proceed.

Referring to FIG. 10, since the light emitting element ED need not emit light during a data writing period for supplying the data voltage Vdata to the subpixel SP in the display driving period Ton, the split cathode electrode SCE(n) may be in an electrically floating state (first floating state).

Referring to FIGS. 9A, 9B, and 10, the period during which the split cathode electrode SCE(n) is in the floating state may include a first floating state period FS1 and a second floating state period FS2.

The first floating state period FS1 may overlap the period during which the (n−3)th scan carry signal C(n−3) and the (n−3)th carry signal C_CMO(n−3) have a high level voltage.

The second floating state period FS2 does not overlap the period during which the (n−3)th scan carry signal C(n−3) and the (n−3)th carry signal C_CMO(n−3) have a high level voltage.

During the first floating state period FS1, the Q node Q_CMO(n) of the cathode driving circuit CGIP(n) and the Q node Q(n) of the scan driving circuit SGIP(n) may have the same voltage change pattern, and the QB node QB_CMO(n) of the cathode driving circuit CGIP(n) and the QB node QB(n) of the scan driving circuit SGIP(n) may have the same voltage change pattern.

During the first floating state period FS1, the Q node Q_CMO(n) of the cathode driving circuit CGIP(n) and the Q node Q(n) of the scan driving circuit SGIP(n) may have a state of having a low level voltage and a state of having a first high level voltage increased from the low level voltage.

During the first floating state period FS1, the QB node QB_CMO(n) of the cathode driving circuit CGIP(n) and the QB node QB(n) of the scan driving circuit SGIP(n) may have a state of having a high level voltage and a state of having a low level voltage decreased from the high level voltage.

Referring to FIGS. 9A, 9B, and 10, if the cathode voltage EVSS is applied to the split cathode electrode SCE(n) after the first floating state period FS1, the voltages of the Q node Q_CMO(n) of the cathode driving circuit CGIP(n) and the Q node Q(n) of the scan driving circuit SGIP(n) may increase from the first high level voltage to a second high level voltage.

Referring to FIGS. 9A, 9B, and 10, if the cathode voltage EVSS is applied to the split cathode electrode SCE(n) after the first floating state period FS1, the scan driving circuit SGIP(n) may output a scan carry signal C(n) of the high level voltage and a scan signal SC(n) of the high level voltage.

Figure 11A:
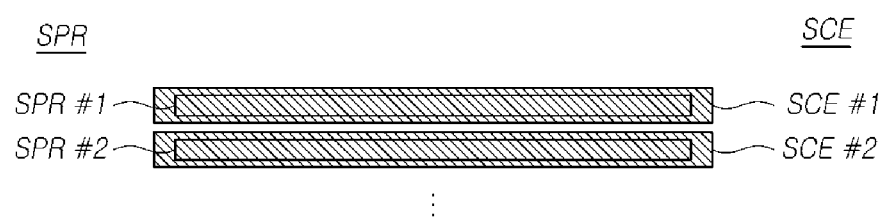
FIGS. 11A and 11B exemplarily illustrate a relationship between a subpixel row and a split cathode electrode in a display device according to embodiments of the disclosure.
Figure 11B:
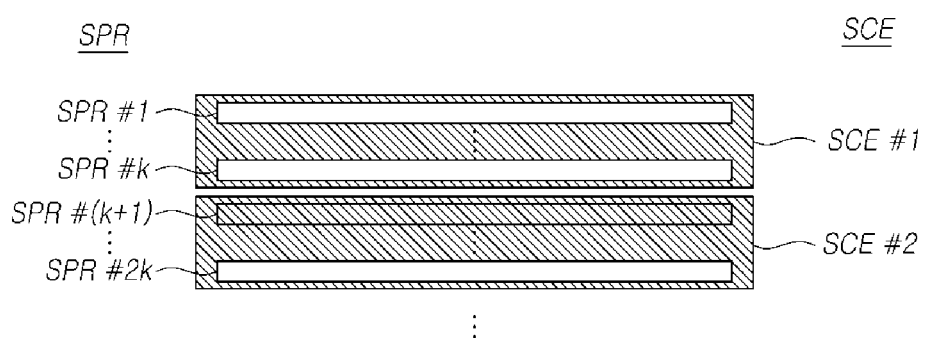

FIGS. 11A and 11B exemplarily illustrate a relationship between a subpixel row (SP Row) SPR and a split cathode electrode SCE in a display device according to embodiments of the disclosure.

Referring to FIG. 11A, in the display device 100 according to embodiments of the disclosure, each of the plurality of split cathode electrodes SCE may overlap anode electrodes AE included in one subpixel row SPR among a plurality of anode electrodes AE.

For example, the first split cathode electrode SCE #1 may correspond to the first subpixel row SPR #1. The first split cathode electrode SCE #1 may overlap the anode electrodes AE included in the first subpixel row SPR #1, forming the light emitting elements ED of the first subpixel row SPR #1.

The second split cathode electrode SCE #2 positioned next to the first split cathode electrode SCE #1 may correspond to the second subpixel row SPR #2 positioned next to the first subpixel row SPR #1. The second split cathode electrode SCE #2 may overlap the anode electrodes AE included in the second subpixel row SPR #2, forming the light emitting elements ED of the second subpixel row SPR #2.

Referring to FIG. 11B, in the display device 100 according to embodiments of the disclosure, each of the plurality of split cathode electrodes SCE may overlap anode electrodes AE included in two or more subpixel rows SPR among a plurality of anode electrodes AE.

For example, the first split cathode electrode SCE #1 may correspond to the first to kth subpixel rows SPR #1 to SPR #k (where k is a natural number of 2 or more). The first split cathode electrode SCE #1 may overlap the anode electrodes AE included in the first to kth subpixel rows SPR #1 to SPR #k, forming the light emitting elements ED of the first to kth subpixel rows SPR #1 to SPR #k.

The second split cathode electrode SCE #2 positioned next to the first split cathode electrode SCE #1 may correspond to the (k+1)th to 2kth subpixel rows SPR #(k+1) to SPR #2k. The second split cathode electrode SCE #2 may overlap the anode electrodes AE included in the (k+1)th to 2kth subpixel rows SPR #(k+1) to SPR #2k, forming the light emitting elements ED of the (k+1)th to 2kth subpixel rows SPR #(k+1) to SPR #2k.

Figure 12A:
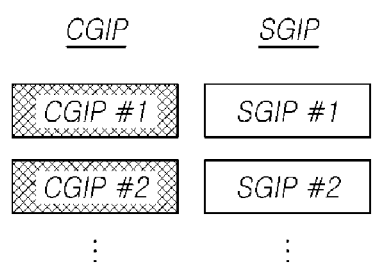
FIGS. 12A and 12B exemplarily illustrate a relationship between a cathode driving circuit and a scan driving circuit in a display device according to embodiments of the disclosure.
Figure 12B:
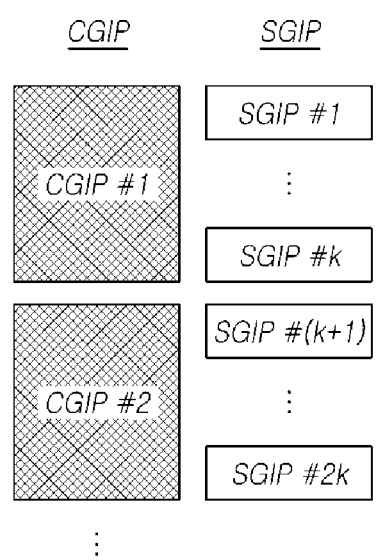

FIGS. 12A and 12B exemplarily illustrate a relationship between a cathode driving circuit CGIP and a scan driving circuit SGIP in a display device according to embodiments of the disclosure.

Referring to FIG. 12A, the display device 100 according to embodiments of the disclosure may further include a plurality of scan driving circuits SGIP #1, SGIP #2, ... which respectively correspond to the plurality of gate lines GL and output scan signals to the plurality of gate lines GL, respectively. Each of the plurality of scan driving circuits SGIP #1, SGIP #2, ... may be configured like the scan driving circuit SGIP(n) of FIG. 9B.

Referring to FIG. 12A, when each of the plurality of split cathode electrodes SCE corresponds to one subpixel row SPR (FIG. 11A), each of the plurality of cathode driving circuits CGIP #1, CGIP #2, ... may correspond to one scan driving circuit SGIP and be disposed on the substrate SUB. One scan driving circuit SGIP is a circuit that drives one gate line GL disposed in one subpixel row SPR. Each of the plurality of cathode driving circuits CGIP #1, CGIP #2, ... may be configured like the cathode driving circuit CGIP(n) of FIG. 9A.

For example, referring to FIG. 12A, the first cathode driving circuit CGIP #1 may be disposed on the substrate SUB to correspond to the first scan driving circuit SGIP #1. The second cathode driving circuit CGIP #2 may be disposed on the substrate SUB to correspond to the second scan driving circuit SGIP #2.

Referring to FIG. 12B, the display device 100 according to embodiments of the disclosure may further include a plurality of scan driving circuits SGIP #1, ... , SGIP #k, SGIP #(k+1), ... , SGIP #2k which respectively correspond to the plurality of gate lines GL and output scan signals to the plurality of gate lines GL, respectively. k may be a natural number of 2 or more. Each of the plurality of scan driving circuits SGIP #1, SGIP #2, ... may be configured like the scan driving circuit SGIP(n) of FIG. 9B.

Referring to FIG. 12B, when each of the plurality of split cathode electrodes SCE corresponds to two or more subpixel rows SPR (FIG. 11B), each of the plurality of cathode driving circuits CGIP #1, CGIP #2, ... may correspond to two or more scan driving circuits SGIP #1, ... , SGIP #k, SGIP #(k+1), ... , SGIP #2k and be disposed on the substrate SUB. Each of the plurality of cathode driving circuits CGIP #1, CGIP #2, ... may be configured like the cathode driving circuit CGIP(n) of FIG. 9A.

For example, referring to FIG. 12B, the first cathode driving circuit CGIP #1 may be disposed on the substrate SUB to correspond to the first to kth scan driving circuits SGIP #1 to SGIP #k (where i is a natural number equal to or larger than 2). The second cathode driving circuit CGIP #2 may be disposed on the substrate SUB to correspond to the (k+1)th to 2kth scan driving circuits SGIP #(k+1) to SGIP #2k.

The cathode driving circuit CGIP and the scan driving circuit SGIP described above in connection with FIGS. 9A and 9B are briefly described again below.

Referring to FIGS. 9A and 9B, the plurality of cathode driving circuits CGIP may include an nth cathode driving circuit CGIP(n). The plurality of scan driving circuits SGIP may include an nth scan driving circuit SGIP(n).

The nth cathode driving circuit CGIP(n) may include a cathode pull-up transistor T6 and a cathode pull-down transistor T7 to output the nth control gate signal CGS(n).

The nth scan driving circuit SGIP(n) may include a scan pull-up transistor M6 and a scan pull-down transistor M7 to output the nth scan signal SC(n).

The gate node of the cathode pull-up transistor T6 may be electrically connected to the first Q node Q_CMO(n), and the gate node of the cathode pull-down transistor T7 may be electrically connected to the first QB node QB_CMO(n).

The gate node of the scan pull-up transistor M6 may be electrically connected to the second Q node Q(n), and the gate node of the scan pull-down transistor M7 may be electrically connected to the second QB node QB(n).

The first Q node Q_CMO(n) and the second Q node Q(n) may be electrically separated from each other. The first QB node QB_CMO(n) may be electrically separated from the second QB node QB(n).

The nth cathode driving circuit CGIP(n) may connect the cathode carry pull-up transistor T6*cr* and the cathode carry pull-down transistor T7*cr* to output the nth cathode carry signal C_CMO(n).

The gate node of the cathode carry pull-up transistor T6*cr* may be electrically connected to the first Q node Q_CMO (n). The gate node of the cathode carry pull-down transistor T7*cr* may be electrically connected to the first QB node QB_CMO(n).

The nth scan driving circuit SGIP(n) may connect the scan carry pull-up transistor M6*cr* and the scan carry pull-down transistor M7*cr* to output the nth scan carry signal C(n).

The gate node of the scan carry pull-up transistor M6*cr* may be electrically connected to the second Q node Q(n). The gate node of the scan carry pull-down transistor M7*cr* may be electrically connected to the second QB node QB(n).

The first Q node Q_CMO(n) and the second Q node Q(n) may be electrically separated from each other. The first QB node QB_CMO(n) may be electrically separated from the second QB node QB(n).

As shown in FIGS. 12A and 12B, the cathode driving circuit CGIP and the scan driving circuit SGIP may be configured separately. Accordingly, the bezel size of the display panel 110 may increase, so that the display area DA may be reduced.

Accordingly, the display device 100 according to embodiments of the disclosure does not separately include the cathode driving circuit CGIP and the scan driving circuit SGIP, but may include a cathode-scan integrated driving circuit C/S-GIP that may function as both a cathode driving circuit CGIP and a scan driving circuit SGIP.

The cathode-scan integrated driving circuit C/S-GIP capable of functioning as both a cathode driving circuit CGIP and a scan driving circuit SGIP is described below.

Figure 13:
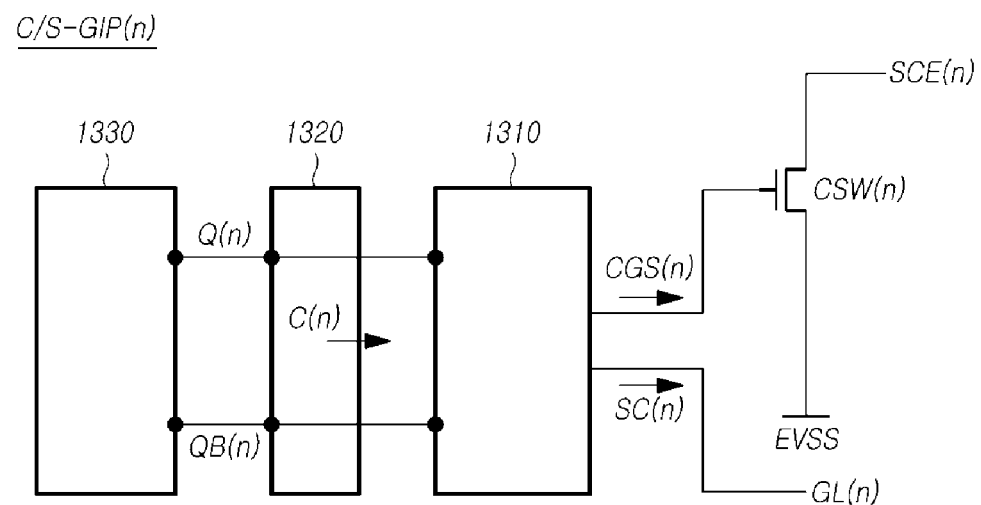
FIG. 13 illustrates a cathode-scan integrated driving circuit of a display device according to embodiments of the disclosure.

FIG. 13 illustrates a cathode-scan integrated driving circuit C/S-GIP of a display device 100 according to embodiments of the disclosure.

Referring to FIG. 13, the nth cathode-scan integrated driving circuit C/S-GIP(n) may include a common output buffer unit 1310 for outputting an nth scan signal SC(n) and an nth control gate signal CGS(n).

Referring to FIG. 13, the nth cathode-scan integrated driving circuit C/S-GIP(n) may further include a common carry output unit 1320 for outputting an nth common carry signal C(n).

Referring to FIG. 13, the cathode-scan integrated driving circuit C/S-GIP(n) may further include a common controller 1330 for controlling the common output buffer unit 1310 and the common carry output unit 1320.

Referring to FIG. 13, the common controller 1330 may control the voltage of each of the Q node Q(n) and the QB node QB(n) to control the common output buffer unit 1310 and the common carry output unit 1320.

The Q node Q(n) may be commonly connected to the common output buffer unit 1310 and the common carry output unit 1320, and the QB node QB(n) may be commonly connected to the common output buffer unit 1310 and the common carry output unit 1320.

The voltage level of the Q node Q(n) and the voltage level of the QB node QB(n) may be opposite to each other.

When the voltage of the Q node Q(n) is a high level voltage (first high level voltage or second high level voltage), the voltage of the QB node QB(n) may be a low level voltage. The second high level voltage may be higher than the first high level voltage, and the first high level voltage may be higher than the low level voltage.

When the voltage of the Q node Q(n) is a low level voltage, the voltage of the QB node QB(n) may be a high level voltage. The high level voltage may be higher than the low level voltage.

The common output buffer unit 1310 may output a control gate signal CGS(n) having the high level voltage or a control gate signal CGS(n) having the low level voltage according to the voltage level of each of the Q node Q(n) and the QB node QB(n).

The control gate signal CGS(n) may be applied to the gate node of the control switching element CSW(n). The control switching element CSW(n) may be turned on or off depending on the control gate signal CGS(n).

The electrical state of the split cathode electrode SCE(n) may be varied depending on the on/off state of the control switching element CSW(n). In other words, the split cathode electrode SCE(n) may be a voltage-applied state in which the cathode voltage EVSS is applied or a floating state in which no voltage is applied, depending on the on/off state of the control switching element CSW(n).

If the control switching element CSW(n) is turned on, the cathode voltage EVSS may be supplied to the split cathode electrode SCE(n) through the control switching element CSW(n).

If the control switching element CSW(n) is turned off, no voltage is applied to the split cathode electrode SCE(n) so that the split cathode electrode SCE(n) may be in the floating state.

Further, the common output buffer unit 1310 may output a scan signal SC(n) having the high level voltage to the nth gate line GL(n) or a scan signal SC(n) having the low level voltage to the nth gate line GL(n) depending on the voltage level of each of the Q node Q(n) and the QB node QB(n).

The common carry output unit 1320 may output a common carry signal C(n) having the high level voltage or a common carry signal C(n) having the low level voltage depending on the voltage level of each of the Q node Q(n) and the QB node QB(n).

The common output buffer unit 1310 may generate the control gate signal CGS(n) and the scan signal SC(n) using the common carry signal C(n). In other words, the common output buffer unit 1310 may commonly use the common carry signal C(n) when generating the control gate signal CGS(n) and the scan signal SC(n).

Figure 14:
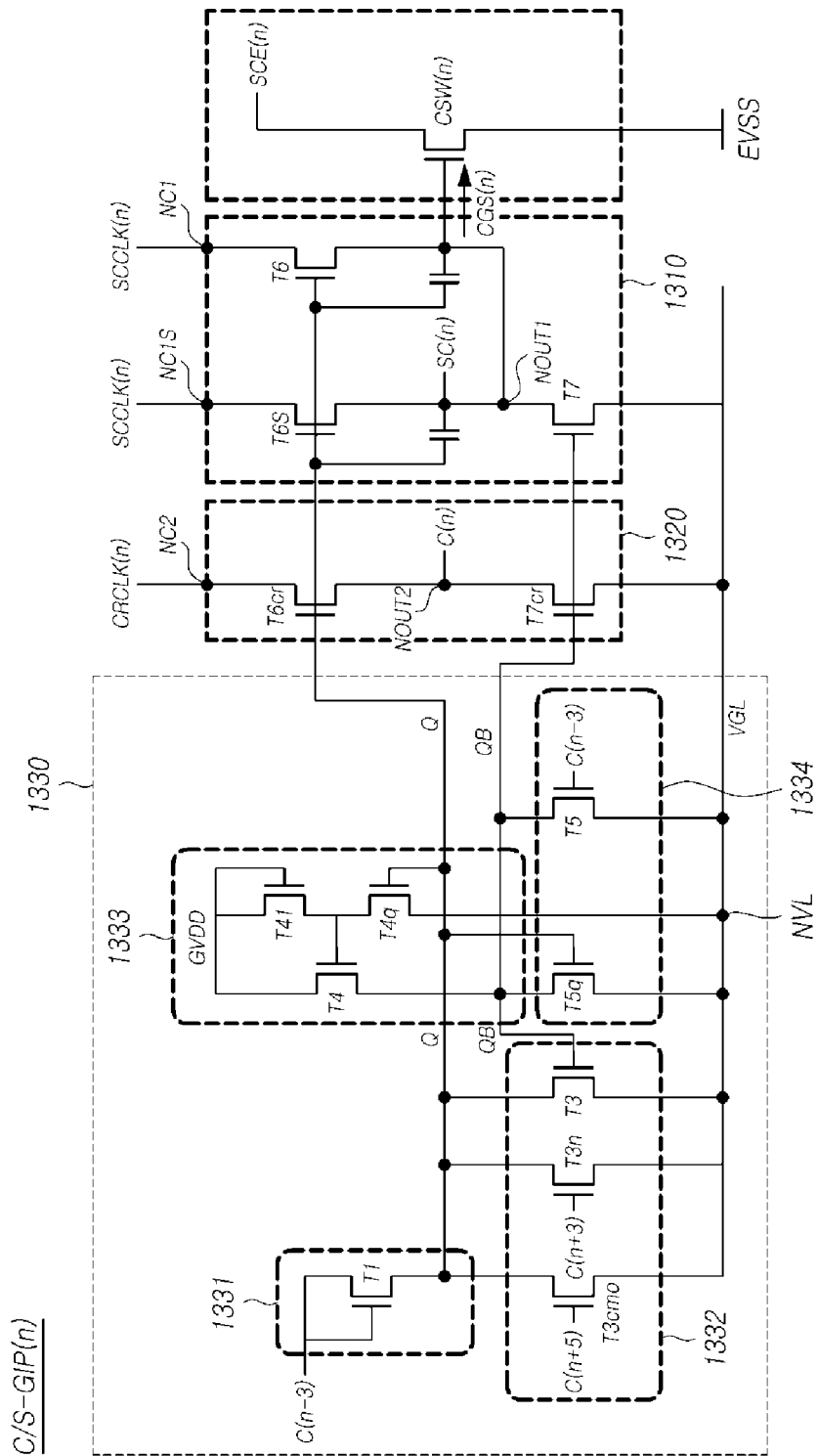
FIG. 14 is a view illustrating, in detail, a cathode-scan integrated driving circuit according to embodiments of the disclosure.

FIG. 14 illustrates, in detail, an nth cathode-scan integrated driving circuit C/S-GIP(n) of a display device 100 according to embodiments of the disclosure.

Referring to FIG. 14, the nth cathode-scan integrated driving circuit C/S-GIP(n) may include a common output buffer unit 1310 for outputting an nth scan signal SC(n) and an nth control gate signal CGS(n), a common carry output unit 1320 for outputting an nth common carry signal C(n), and a common controller 1330 for controlling the common output buffer unit 1310 and the common carry output unit 1320.

Referring to FIG. 14, the common output buffer unit 1310 may include a cathode pull-up transistor T6, a scan pull-up transistor T6S, and a common pull-down transistor T7.

The cathode pull-up transistor T6 may switch connection between the cathode clock node NC1 to which the cathode clock signal CMOCLK(n) is input and the common output node NOUT1. A capacitor may be connected between the gate node of the cathode pull-up transistor T6 and the common output node NOUT1.

The scan pull-up transistor T6S may switch connection between the scan clock node NC1S to which the scan clock signal SCCLK(n) is input and the common output node NOUT1. A capacitor may be connected between the gate node of the scan pull-up transistor T6S and the common output node NOUT1.

The gate node of the cathode pull-up transistor T6 and the gate node of the scan pull-up transistor T6S may be electrically connected to the Q node Q(n).

The common output node NOUT1 may be electrically connected with both the gate line GL(n) to which the scan signal SC(n) is input and the gate node of the control switching element CSW(n) to which the control gate signal CGS(n) is input.

In other words, in the nth cathode-scan integrated driving circuit C/S-GIP(n), the point where the control gate signal CGS(n) is output and the point where the scan signal SC(n) is output may be the same as the common output node NOUT1.

The cathode pull-up transistor T6 and the scan pull-up transistor T6S may be commonly connected to the common pull-down transistor T7.

The common pull-down transistor T7 may switch the connection between the low level voltage node NVL to which the low level gate voltage VGL is input and the common output node NOUT1. The gate node of the common pull-down transistor T7 may be electrically connected to the QB node QB(n).

The voltage level of the Q node Q(n) and the voltage level of the QB node QB(n) may be opposite to each other.

When the voltage of the Q node Q(n) is a high level voltage and the voltage of the QB node QB(n) is a low level voltage, the cathode pull-up transistor T6 and the scan pull-up transistor T6S may be turned on, and the common pull-down transistor T7 may be turned off.

When the voltage of the Q node Q(n) is a high level voltage and the voltage of the QB node QB(n) is a low level voltage, the cathode clock signal CMOCLK(n) may be output to the common output node NOUT1 through the turned-on cathode pull-up transistor T6.

The cathode clock signal CMOCLK(n) output to the common output node NOUT1 may correspond to the control gate signal CGS(n) and may be applied to the gate node of the control switching element CSW(n).

When the voltage of the Q node Q(n) is a high level voltage and the voltage of the QB node QB(n) is a low level voltage, the scan clock signal SCCLK(n) may be output to the common output node NOUT1 through the turned-on scan pull-up transistor T6S.

The scan clock signal SCCLK(n) output to the common output node NOUT1 may correspond to the scan signal SC(n) having a high level voltage and be applied to the corresponding gate line GL(n).

When the voltage of the Q node Q(n) is a low level voltage and the voltage of the QB node QB(n) is a high level voltage, the cathode pull-up transistor T6 and the scan pull-up transistor T6S may be turned off, and the common pull-down transistor T7 may be turned on.

When the voltage of the Q node Q(n) is a high level voltage and the voltage of the QB node QB(n) is a low level voltage, the low level gate voltage VGL may be output to the common output node NOUT1 through the turned-on common pull-down transistor T7.

The low level gate voltage VGL output to the common output node NOUT1 may correspond to the scan signal SC(n) having a low level voltage and be applied to the gate line GL(n).

The low level gate voltage VGL output to the common output node NOUT1 may correspond to the control gate signal CGS(n) and be applied to the gate node of the control switching element CSW(n).

Referring to FIG. 14, the common carry output unit 1320 may include a carry pull-up transistor T6cr and a carry pull-down transistor T7cr.

The carry pull-up transistor T6cr may switch connection between the common carry clock node NC2 to which the common carry clock signal CRCLK(n) is input and the common carry output node NOUT2.

The carry pull-down transistor T7cr may switch connection between the low level voltage node NVL to which the low level gate voltage VGL is input and the common carry output node NOUT2.

The gate node of the carry pull-up transistor T6cr may be electrically connected to the Q node Q(n). Accordingly, the gate node of the carry pull-up transistor T6cr may be electrically connected to the gate node of the cathode pull-up transistor T6 and the gate node of the scan pull-up transistor T6S. In other words, the gate node of the cathode pull-up transistor T6, the gate node of the scan pull-up transistor T6S, and the gate node of the carry pull-up transistor T6cr are all electrically connected to the Q node Q(n).

The gate node of the carry pull-down transistor T7c may be electrically connected to the QB node QB(n). Accordingly, the gate node of the carry pull-down transistor T7c may be electrically connected to the gate node of the common pull-down transistor T7. In other words, both the gate node of the common pull-down transistor T7 and the gate node of the carry pull-down transistor T7c may be electrically connected to the QB node QB(n).

The voltage level of the Q node Q(n) and the voltage level of the QB node QB(n) may be opposite to each other.

When the voltage of the Q node Q(n) is a high level voltage and the voltage of the QB node QB(n) is a low level voltage, the carry pull-up transistor T6cr may be turned on, and the carry pull-down transistor T7c may be turned off.

When the voltage of the Q node Q(n) is a high level voltage and the voltage of the QB node QB(n) is a low level voltage, the common carry clock signal CRCLK(n) may be output to the common carry output node NOUT2 through the turned-on carry pull-up transistor T6cr. The common carry clock signal CRCLK(n) output to the common carry output node NOUT2 may correspond to the common carry signal C(n).

When the voltage of the Q node Q(n) is a low level voltage and the voltage of the QB node QB(n) is a high level voltage, the carry pull-up transistor T6cr may be turned off, and the carry pull-down transistor T7c may be turned on.

When the voltage of the Q node Q(n) is a low level voltage and the voltage of the QB node QB(n) is a high level voltage, the low level gate voltage VGL may be output to the common carry output node NOUT2 through the turned-on carry pull-down transistor T7c. The low level gate voltage VGL output to the common carry output node NOUT2 may correspond to the common carry signal C(n).

Referring to FIG. 14, the common controller 1330 may control the voltage of each of the Q node Q(n) and the QB node QB(n) to control the common output buffer unit 1310 and the common carry output unit 1320.

Referring to FIG. 14, the Q node Q(n) may be commonly connected to the common output buffer unit 1310 and the common carry output unit 1320, and the QB node QB(n) may be commonly connected to the common output buffer unit 1310 and the common carry output unit 1320.

Referring to FIG. 14, the common controller 1330 may include a Q node charging unit 1331 for charging the Q node Q(n), a Q node discharging unit 1332 for discharging the Q node Q(n), a QB node charging unit 1333 for charging the QB node QB(n), and a QB node discharging unit 1334 for discharging the QB node QB(n).

The Q node charging unit 1331 may include a Q node charging transistor T1 for charging the Q node Q(n).

The Q node charging transistor T1 may control connection between the node to which the (n−3)th common carry signal C(n−3) is input and the Q node Q(n) according to the (n−3)th common carry signal C(n−3). The Q node charging transistor T1 is in a diode-connected state, and the (n−3)th common carry signal C(n−3) may be simultaneously input to the drain node (or source node) and the gate node.

If the Q node charging transistor T1 is turned on by the high level voltage of the (n−3)th common carry signal C(n−3), the high level voltage of the (n−3)th common carry signal C(n−3) may be applied to the Q node Q(n) through the Q node charging transistor T1. Accordingly, the Q node Q(n) may be charged.

The Q node discharge unit 1332 may include at least one of first to third Q node discharging transistors T3cmo, T3n, and T3.

The first Q node discharging transistor T3cmo may control connection between the Q node Q(n) and the low level voltage node NVL according to the (n+5)th common carry signal C(n+5) applied to the gate node.

If the first Q node discharging transistor T3cmo is turned on, the low level gate voltage VGL of the low level voltage node NVL may be applied to the Q node Q(n) through the first Q node discharging transistor T3com. Accordingly, the Q node Q(n) may be discharged.

The second Q node discharging transistor T3n may control connection between the Q node Q(n) and the low level voltage node NVL according to the (n+3)th common carry signal C(n+3) applied to the gate node.

If the second Q node discharging transistor T3n is turned on, the low level gate voltage VGL of the low level voltage node NVL may be applied to the Q node Q(n) through the second Q node discharging transistor T3n. Accordingly, the Q node Q(n) may be discharged.

The third Q node discharging transistor T3 may control connection between the Q node Q(n) and the low level voltage node NVL according to the voltage state of the QB node QB(n) connected to the gate node.

If the third Q node discharging transistor T3 is turned on, the low level gate voltage VGL of the low level voltage node NVL may be applied to the Q node Q(n) through the third Q node discharging transistor T3. Accordingly, the Q node Q(n) may be discharged.

The QB node charging unit 1333 may include a QB node charging transistor T4 connected between the node to which the gate driving voltage GVDD is input and the QB node QB(n).

The QB node charging unit 1333 may further include a first control transistor T41 and a second control transistor T4q.

The first control transistor T41 may be in a diode-connected state in which the drain node (or source node) and the gate node are electrically connected with each other, be controlled to be turned on/off by the gate driving voltage GVDD and control connection between the node to which the gate driving voltage GVDD is input and the gate node of the QB node charging transistor T4.

The second control transistor T4q may be controlled to be turned on or off by the voltage of the Q node Q(n) and be connected between the gate node of the QB node charging transistor T4 and the low level voltage node NVL.

If the first control transistor T41 is turned on so that the gate driving voltage GVDD is applied to the gate node of the QB node charging transistor T4, the QB node charging transistor T4 may be turned on. Accordingly, the node to which the gate driving voltage GVDD is input and the QB node QB(n) may be electrically connected with each other through the turned-on QB node charging transistor T4. Accordingly, the gate driving voltage GVDD may be applied to the QB node QB(n), charging the QB node QB(n).

The QB node discharging unit 1334 may include at least one of first and second QB node discharging transistors T5 and T5q for controlling connection between the low level voltage node NVL and the QB node QB(n).

The first QB node discharging transistor T5 may be controlled to be turned on or off according to the (n−3)th common carry signal C(n−3) and control connection between the low level voltage node NVL and the QB node QB(n).

The second QB node discharging transistor T5q may be controlled to be turned on or off according to the voltage state of the Q node Q(n) and control connection between the low level voltage node NVL and the QB node QB(n).

As at least one of the first QB node discharging transistor T5 or the second QB node discharging transistor T5q is turned on, the low level voltage node NVL and the QB node QB(n) may be electrically connected so that the low level gate voltage VGL may be applied to the QB node QB(n). Accordingly, the QB node QB(n) may be discharged.

Figure 15:
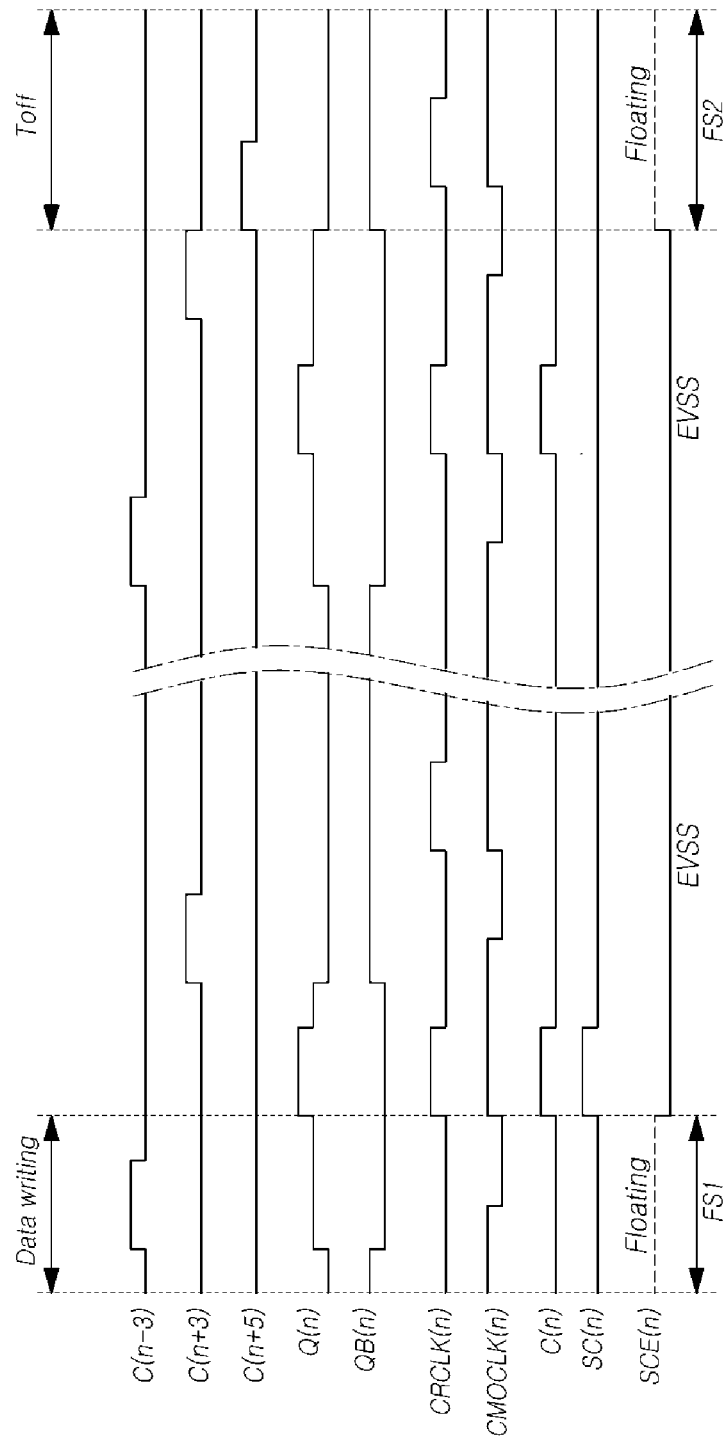
FIG. 15 is a driving timing diagram illustrating the cathode-scan integrated driving circuit of FIG. 14 according to embodiments of the disclosure.

FIG. 15 is a driving timing diagram illustrating the nth cathode-scan integrated driving circuit C/S-GIP(n) of FIG. 14. In the following description, reference is also made to FIG. 14.

Referring to FIG. 14, the nth cathode-scan integrated driving circuit C/S-GIP(n) may generate a control gate signal CGS(n) and a scan signal SC(n) based on various signals and output them to the gate node of the control switching element CSW(n) and the nth gate line GL(n), respectively.

Referring to FIGS. 14 and 15, various signals involved in the generation of the control gate signal CGS(n) and the scan signal SC(n) in the nth cathode-scan integrated driving circuit C/S-GIP(n) may include an (n−3)th scan carry signal C(n−3) of the (n−3)th cathode-scan integrated driving circuit, an (n+3)th scan carry signal C(n+3) of the (n+3)th cathode-scan integrated driving circuit, an (n+5)th scan carry signal C(n+5) of the (n+5)th cathode-scan integrated driving circuit, a voltage of the Q node Q(n), a voltage of the QB node QB(n), a common carry clock signal CRCLK(n), a cathode clock signal CMOCLK(n), a scan clock signal SCCLK(n), a scan carry signal C(n), and a scan signal SC(n).

Referring to FIGS. 14 and 15, when the Q node Q(n) has a high level voltage so that the cathode clock signal CMOCLK(n) has a high level voltage in the turned-on state of the cathode pull-up transistor T6, the high level voltage of the cathode clock signal CMOCLK(n) may correspond to the control gate signal CGS(n) and be output to the common output node NOUT1 through the turned-on cathode pull-up transistor T6.

The control switching element CSW(n) may be turned on by the control gate signal CGS(n) of the high level voltage output to the common output node NOUT1. Accordingly, the cathode voltage EVSS applied to the cathode voltage line CVL may be supplied to the split cathode electrode SCE(n) through the control switching element CSW(n).

Referring to FIGS. 14 and 15, when the QB node QB(n) has a high level voltage so that the common pull-down transistor T7 is in the turned-on state, the low level gate voltage VGL may correspond to the control gate signal CGS(n) and be output to the common output node NOUT1 through the turned-on common pull-down transistor T7.

Referring to FIGS. 14 and 15, when the Q node Q_CMO(n) has a high level voltage so that the cathode clock signal CMOCLK(n) has a low level voltage in the turned-on state of the cathode pull-up transistor T6, the low level voltage of the cathode clock signal CMOCLK(n) may correspond to the control gate signal CGS(n) and be output to the common output node NOUT1 through the turned-on cathode pull-up transistor T6.

As described above, the low level gate voltage VGL or the low level voltage of the cathode clock signal CMOCLK(n) may correspond to the control gate signal CGS(n) and be output to the common output node NOUT1. The control switching element CSW(n) may be turned off by the control gate signal CGS(n). Accordingly, the cathode voltage line CVL to which the cathode voltage EVSS is applied and the split cathode electrode SCE(n) may be floated.

Referring to FIG. 15, when the split cathode electrode SCE(n) is in an electrically floating state (second floating state), a display stop driving period Toff may proceed.

Referring to FIG. 15, since the light emitting element ED need not emit light during a data writing period for supplying the data voltage Vdata to the subpixel SP in the display driving period Ton, the split cathode electrode SCE(n) may be in an electrically floating state (first floating state).

Referring to FIGS. 14 and 15, the period during which the split cathode electrode SCE(n) is in the floating state may include a first floating state period FS1 and a second floating state period FS2.

The first floating state period FS1 may overlap the period during which the (n−3)th common carry signal C(n−3) has a high level voltage.

The second floating state period FS2 does not overlap the period during which the (n−3)th common carry signal C(n−3) has a high level voltage.

Referring to FIGS. 14 and 15, during the first floating state period FS1, the Q node Q(n) of the nth cathode-scan integrated driving circuit C/S-GIP(n) may have a state of having a low level voltage and a state of having a first high level voltage increased from the low level voltage.

During the first floating state period FS1, the Q node Q(n) of the cathode-scan integrated driving circuit C/S-GIP(n) may have a state of having a high level voltage and a state of having a low level voltage decreased from the high level voltage.

Referring to FIGS. 14 and 15, if the cathode voltage EVSS is applied to the split cathode electrode SCE(n) after the first floating state period FS1, the voltage of the Q node Q(n) of the cathode-scan integrated driving circuit C/S-GIP(n) may be increased from the first high level voltage to a second high level voltage.

Referring to FIGS. 14 and 15, if the cathode voltage EVSS is applied to the split cathode electrode SCE(n) after the first floating state period FS1, the cathode-scan integrated driving circuit C/S-GIP(n) may output the common carry signal C(n) of the high level voltage and the scan signal SC(n) of the high level voltage.

The foregoing embodiments are briefly described below.

According to embodiments of the disclosure, there may be provided a display device 100 comprising: a substrate SUB, a plurality of driving transistors DRT on the substrate SUB, a plurality of anode electrodes AE connected with the plurality of driving transistors DRT, a light emitting layer EL on the plurality of anode electrodes AE, and a plurality of split cathode electrodes SCE on the light emitting layer EL.

In the display device according to embodiments of the disclosure, each of the plurality of split cathode electrodes SCE may alternate between a first state applied with a cathode voltage EVSS and a second state of floating not applied with the cathode voltage EVSS.

The display device 100 according to embodiments of the disclosure may further comprise a plurality of gate lines GL and a plurality of data lines DL crossing each other.

In the display device 100 according to embodiments of the disclosure, each of the plurality of split cathode electrodes SCE may be disposed in a direction crossing the plurality of data lines DL.

In the display device 100 according to embodiments of the disclosure, each of the plurality of split cathode electrodes SCE may overlap anode electrodes AE included in one subpixel row SPR among a plurality of anode electrodes AE.

Alternatively, in the display device 100 according to embodiments of the disclosure, each of the plurality of split cathode electrodes SCE may overlap anode electrodes AE included in two or more subpixel rows SPR among a plurality of anode electrodes AE.

In the display device 100 according to embodiments of the disclosure, the electrical state of each of the plurality of split cathode electrodes (SCE) may be independently controlled.

The display device according to embodiments of the disclosure may further comprise at least one cathode voltage line CVL receiving the cathode voltage EVSS.

The electrical state of each of the plurality of split cathode electrodes SCE may repeat a shorted state of being electrically connected with the at least one cathode voltage line CVL and a floating state of being electrically separated from the at least one cathode voltage line CVL.

In the display device 100 according to embodiments of the disclosure, while at least one split cathode electrode among the plurality of split cathode electrodes SCE is in the shorted state of being electrically connected with the at least one cathode voltage line CVL, at least one subpixel row SPR overlapping the at least one split cathode electrode may emit light.

In the display device 100 according to embodiments of the disclosure, while at least one split cathode electrode among the plurality of split cathode electrodes SCE is in the floating state of being electrically separated from the at least one cathode voltage line CVL, at least one subpixel row SPR overlapping the at least one split cathode electrode may not emit light.

The display device 100 according to embodiments of the disclosure may further comprise a plurality of control switching elements CSW and a plurality of cathode driving circuits CGIP.

The plurality of control switching elements CSW may correspond to the plurality of split cathode electrodes SCE, respectively.

The plurality of control switching elements CSW may be elements for switching connection between each of the plurality of split cathode electrodes SCE and at least one cathode voltage line CVL.

The plurality of cathode driving circuits CGIP respectively correspond to the plurality of control switching elements CSW and may output a control gate signal CGS for controlling on-off of each of the plurality of control switching elements CSW.

The plurality of control switching elements CSW and the plurality of cathode driving circuits CGIP may be disposed on the substrate SUB and be positioned in the non-display area NDA.

The display device 100 according to embodiments of the disclosure may further include a plurality of scan driving circuits SGIP #1, SGIP #2, . . . which respectively correspond to the plurality of gate lines GL and output scan signals to the plurality of gate lines GL, respectively.

In the display device 100 according to embodiments of the disclosure, each of the plurality of cathode driving circuits CGIP #1, CGIP #2, . . . may be disposed on the substrate SUB to correspond to one scan driving circuit SGIP.

The display device 100 according to embodiments of the disclosure may further include a plurality of scan driving circuits SGIP #1, . . . , SGIP #k, SGIP #(k+1), . . . , SGIP #2k which respectively correspond to the plurality of gate lines GL and output scan signals to the plurality of gate lines GL, respectively. k may be a natural number of 2 or more.

The plurality of cathode driving circuits may include an nth cathode driving circuit.

The plurality of scan driving circuits may include an nth scan driving circuit.

The nth cathode driving circuit may include a cathode pull-up transistor and a cathode pull-down transistor to output an nth control gate signal.

The nth scan driving circuit may include a scan pull-up transistor and a scan pull-down transistor to output an nth scan signal.

The gate node of the cathode pull-up transistor may be electrically connected with a first Q node, and the gate node of the cathode pull-down transistor may be electrically connected with a first QB node.

The gate node of the scan pull-up transistor may be electrically connected with a second Q node, and the gate node of the scan pull-down transistor may be electrically connected with a second QB node.

The first Q node and the second Q node may be electrically separated, and the first QB node and the second QB node may be electrically separated.

The nth cathode driving circuit may connect the cathode carry pull-up transistor and the cathode carry pull-down transistor to output the nth cathode carry signal.

The nth scan driving circuit may connect the scan carry pull-up transistor and the scan carry pull-down transistor to output the nth scan carry signal.

The gate node of the cathode carry pull-up transistor may be electrically connected with the first Q node, and the gate node of the cathode carry pull-down transistor may be electrically connected with the first QB node.

The gate node of the scan carry pull-up transistor may be electrically connected with the second Q node, and the gate node of the scan carry pull-down transistor may be electrically connected with the second QB node.

The first Q node and the second Q node may be electrically separated.

The first QB node and the second QB node may be electrically separated.

The cathode driving circuit and the scan driving circuit may be separated circuits.

A function of the cathode driving circuit and a function of the scan driving circuit may be integrated.

A plurality of cathode-scan integrated driving circuits may output a plurality of control gate signals to a plurality of control switching elements, respectively, and a scan signal to each of a plurality of gate lines to control on/off of each of the plurality of control switching elements.

The plurality of cathode-scan integrated driving circuits may include an nth cathode-scan integrated driving circuit.

The nth cathode-scan integrated driving circuit may include a common output buffer unit.

The common output buffer unit may include a cathode pull-up transistor, a scan pull-up transistor, and a common pull-down transistor to output an nth control gate signal and an nth scan signal.

The gate node of the cathode pull-up transistor and the gate node of the scan pull-up transistor may be electrically connected with the Q node.

The gate node of the common pull-down transistor may be electrically connected with the QB node.

The cathode pull-up transistor and the scan pull-up transistor may be commonly connected to the common pull-down transistor.

In the nth cathode-scan integrated driving circuit, a point where the control gate signal is output may be the same as a point where the scan signal is output.

The nth cathode-scan integrated driving circuit may further include a common carry output unit.

The common carry output unit may include a carry pull-up transistor and a carry pull-down transistor to output a common carry signal.

The gate node of the carry pull-up transistor may be electrically connected with the gate node of the cathode pull-up transistor and the gate node of the scan pull-up transistor.

The gate node of the carry pull-down transistor may be electrically connected with the common pull-down transistor.

In the display device 100 according to embodiments of the disclosure, each of the plurality of cathode driving circuits CGIP #1, CGIP #2, . . . may correspond to two or more scan driving circuits SGIP #1, . . . , SGIP #k, SGIP #(k+1), . . . , SGIP #2k and be disposed on the substrate SUB.

The display device 100 according to embodiments of the disclosure may further comprise a plurality of gate lines GL and a plurality of data lines DL crossing each other.

Each of the plurality of split cathode electrodes SCE may be disposed in a direction crossing the plurality of data lines DL, and at least one cathode voltage line CVL may be disposed in a direction crossing the plurality of gate lines GL.

In the display device 100 according to embodiments of the disclosure, the display driving period Ton and the display stop driving period Toff may be alternately performed on each of one or more subpixel rows.

One or more subpixel rows SPR where the display stop driving period Toff simultaneously proceeds may correspond to one split cathode electrode SCE among the plurality of split cathode electrodes SCE.

At least one split cathode electrode SCE corresponding to one or more subpixel rows SPR where the display stop driving period Toff simultaneously proceeds may be floated from one cathode voltage line CVL.

The area of one or more subpixel rows SPR where the display stop driving period Toff is simultaneously performed may appear in black or low grayscale.

Each of the plurality of subpixels SP included in the display device 100 according to embodiments of the disclosure may include a light emitting element EL, a driving transistor DRT for driving the light emitting element EL, a first transistor SCT1 switching connection between a first node N1 of the driving transistor DRT and a data line DL, a second transistor SENT switching connection between a second node N2 of the driving transistor DRT and a reference voltage line RVL, and a capacitor Cst connected between the first node N1 and the second node N2.

The light emitting element ED in each subpixel SP may include one anode electrode AE of a plurality of anode electrodes AE, a light emitting layer EL, and one split cathode electrode SCE of a plurality of split cathode electrodes SCE.

According to embodiments of the disclosure, there may be provided a display device 100 comprising: a substrate SUB, a plurality of driving transistors DRT on the substrate SUB, a plurality of anode electrodes AE connected with the plurality of driving transistors DRT, a light emitting layer EL on the plurality of anode electrodes AE, and a plurality of split cathode electrodes SCE disposed on the light emitting layer EL.

In the display device 100 according to embodiments of the disclosure, at least one of the plurality of split cathode electrodes SCE may have a different electrical state from the rest.

Among the plurality of split cathode electrodes (SCE), at least one may be in the first state in which the cathode voltage EVSS is applied, and the rest may be in the second state in which it is floated without application of the cathode voltage EVSS.

Subpixels including anode electrodes AE overlapping the split cathode electrode SCE in the second state among the plurality of split cathode electrodes SCE may not emit light.

The display device 100 according to embodiments of the disclosure may further comprise a plurality of gate lines GL and a plurality of data lines DL crossing each other.

Each of the plurality of split cathode electrodes SCE may be disposed in a direction parallel to the plurality of gate lines GL.

As described above, according to embodiments of the disclosure, there may be provided a display device capable of effectively preventing motion blur by a new method without complicated driving.

According to embodiments, there may be provided a display device including a cathode patterning structure and a cathode driving system for preventing motion blur.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed is:

1. A display device, comprising:
a substrate;
a plurality of driving transistors on the substrate;
a plurality of anode electrodes connected with the plurality of driving transistors;
a light emitting layer on the plurality of anode electrodes; and
a plurality of split cathode electrodes on the light emitting layer,
wherein each of the plurality of split cathode electrodes alternates between a first state applied with a cathode voltage and a second state of floating not applied with the cathode voltage,
wherein the display device further comprises:
at least one cathode voltage line receiving the cathode voltage;
a plurality of control switching elements respectively corresponding to the plurality of split cathode electrodes, the plurality of control switching elements configured to switch a connection between each of the plurality of split cathode electrodes and the at least one cathode voltage line; and
a plurality of cathode driving circuits respectively corresponding to the plurality of control switching elements, the plurality of cathode driving circuits configured to output a plurality of control gate signals for controlling a turn on and a turn off of each of the plurality of control switching elements to the plurality of control switching elements, respectively,
wherein the plurality of cathode driving circuits include an nth cathode driving circuit,
wherein the nth cathode driving circuit includes a cathode pull-up transistor and a cathode pull-down transistor configured to output an nth control gate signal,
wherein a gate node of the cathode pull-up transistor is electrically connected with a first Q node, and a gate node of the cathode pull-down transistor is electrically connected with a first QB node.

2. The display device of claim 1, further comprising:
a plurality of gate lines and a plurality of data lines that cross each other,
wherein each of the plurality of split cathode electrodes is disposed in a direction that crosses the plurality of data lines.

3. The display device of claim 2, further comprising:
a plurality of scan driving circuits respectively corresponding to the plurality of gate lines, the plurality of scan driving circuits configured to output scan signals to the plurality of gate lines, respectively,
wherein each of the plurality of cathode driving circuits corresponds to one scan driving circuit or two or more scan driving circuits and is disposed on the substrate.

4. The display device of claim 3, wherein the plurality of scan driving circuits include an nth scan driving circuit, wherein the nth scan driving circuit includes a scan pull-up transistor and a scan pull-down transistor configured to output an nth scan signal, wherein a gate node of the scan pull-up transistor is electrically connected with a second Q node, and a gate node of the scan pull-down transistor is electrically connected with a second QB node, and wherein the first Q node and the second Q node are electrically separated, and the first QB node and the second QB node are electrically separated.

5. The display device of claim 4, wherein the nth cathode driving circuit includes a cathode carry pull-up transistor and a cathode carry pull-down transistor configured to output an nth cathode carry signal, and the nth scan driving circuit includes a scan carry pull-up transistor and a scan carry pull-down transistor configured to output an nth scan carry signal, wherein a gate node of the cathode carry pull-up transistor is electrically connected with the first Q node, and a gate node of the cathode carry pull-down transistor is electrically connected with the first QB node, wherein a gate node of the scan carry pull-up transistor is electrically connected with the second Q node, and a gate node of the scan carry pull-down transistor is electrically connected with the second QB node, and wherein the first Q node and the second Q node are electrically separated, and the first QB node and the second QB node are electrically separated.

6. The display device of claim 1, wherein each of the plurality of split cathode electrodes overlaps anode electrodes included in one subpixel row, the anode electrodes among the plurality of anode electrodes.

7. The display device of claim 1, wherein each of the plurality of split cathode electrodes overlaps anode electrodes included in two or more subpixel rows, the anode electrodes among the plurality of anode electrodes.

8. The display device of claim 1, wherein an electrical state of each of the plurality of split cathode electrodes is independently controlled.

9. The display device of claim 1,
wherein an electrical state of each of the plurality of split cathode electrodes repeats a shorted state of being electrically connected with the at least one cathode voltage line and a floating state of being electrically disconnected from the at least one cathode voltage line.

10. The display device of claim 9, wherein while at least one split cathode electrode among the plurality of split cathode electrodes is in the shorted state of being electrically connected with the at least one cathode voltage line, at least one subpixel row overlapping the at least one split cathode electrode emits light, and while at least one split cathode electrode among the plurality of split cathode electrodes is in the floating state of being electrically disconnected from the at least one cathode voltage line, at least one subpixel row overlapping the at least one split cathode electrode does not emit light.

11. The display device of claim 9, further comprising:
a plurality of control switching elements respectively corresponding to the plurality of split cathode electrodes, the plurality of control switching elements configured to switch connection between each of the plurality of split cathode electrodes and the at least one cathode voltage line; and
a plurality of cathode-scan integrated driving circuits outputting a plurality of control gate signals that controls a turn on and a turn off of each of the plurality of control switching elements to the plurality of control switching elements, respectively, and outputting a scan signal to each of a plurality of gate lines.

12. The display device of claim 11, wherein the plurality of cathode-scan integrated driving circuits include an nth cathode-scan integrated driving circuit, wherein the nth cathode-scan integrated driving circuit includes a common output buffer unit, wherein the common output buffer unit includes a cathode pull-up transistor, a scan pull-up transistor, and a common pull-down transistor configured to output an nth control gate signal and an nth scan signal, wherein a gate node of the cathode pull-up transistor and a gate node of the scan pull-up transistor are electrically connected with a Q node, and a gate node of the common pull-down transistor is electrically connected with a QB node, and wherein the cathode pull-up transistor and the scan pull-up transistor are commonly connected to the common pull-down transistor.

13. The display device of claim 12, wherein in the nth cathode-scan integrated driving circuit, a point where the control gate signal is output is a same as a point where the scan signal is output.

14. The display device of claim 12, wherein the nth cathode-scan integrated driving circuit further includes a common carry output unit, wherein the common carry output unit includes a carry pull-up transistor and a carry pull-down transistor configured to output a common carry signal, wherein a gate node of the carry pull-up transistor is electrically connected with a gate node of the cathode pull-up transistor and a gate node of the scan pull-up transistor, wherein a gate node of the carry pull-down transistor is electrically connected with the common pull-down transistor.

15. The display device of claim 9, further comprising:
a plurality of gate lines and a plurality of data lines that cross each other,
wherein each of the plurality of split cathode electrodes is disposed in a direction that crosses the plurality of data lines, and the at least one cathode voltage line is disposed in a direction that crosses the plurality of gate lines.

16. The display device of claim 1, wherein the plurality of control switching elements and the plurality of cathode driving circuits are disposed on the substrate and positioned in a non-display area.

17. The display device of claim 1, wherein a display driving period and a display stop driving period alternately proceed for each of one or more subpixel rows, and
wherein the one or more subpixel rows which simultaneously proceed with the display stop driving period correspond to one split cathode electrode among the plurality of split cathode electrodes.

18. The display device of claim 17, wherein the one split cathode electrode corresponding to the one or more subpixel rows which simultaneously proceeds with the display stop driving period is floating from at least one cathode voltage line.

19. The display device of claim 17, wherein an area of the one or more subpixel rows which simultaneously proceeds with the display stop driving period appears in black or in a low grayscale.

20. The display device of claim 1, further comprising:
a plurality of subpixels, each of the plurality of subpixels including:
a light emitting element;
a driving transistor configured to drive the light emitting element;
a scan transistor switching connection between a first node of the driving transistor and a data line;
a sensing transistor switching connection between a second node of the driving transistor and a reference voltage line; and
a capacitor connected between the first node and the second node,
wherein the light emitting element includes one anode electrode among the plurality of anode electrodes, the light emitting layer, and one split cathode electrode among the plurality of split cathode electrodes.

21. A display device, comprising:
a substrate;
a plurality of driving transistors on the substrate;
a plurality of anode electrodes connected with the plurality of driving transistors;
a light emitting layer on the plurality of anode electrodes; and
a plurality of split cathode electrodes on the light emitting layer,
wherein an electrical state of at least one of the plurality of split cathode electrodes is different from an electrical state of a remaining split cathode electrodes from the plurality of split cathode electrodes, wherein the display device further comprises:
    at least one cathode voltage line receiving a cathode voltage;
    a plurality of control switching elements respectively corresponding to the plurality of split cathode electrodes, the plurality of control switching elements configured to switch a connection between each of the plurality of split cathode electrodes and the at least one cathode voltage line; and
    a plurality of cathode driving circuits respectively corresponding to the plurality of control switching elements, the plurality of cathode driving circuits configured to output a plurality of control gate signals for controlling a turn on and a turn off of each of the plurality of control switching elements to the plurality of control switching elements, respectively,
    wherein the plurality of cathode driving circuits include an nth cathode driving circuit,
    wherein the nth cathode driving circuit includes a cathode pull-up transistor and a cathode pull-down transistor configured to output an nth control gate signal,
    wherein a gate node of the cathode pull-up transistor is electrically connected with a first Q node, and a gate node of the cathode pull-down transistor is electrically connected with a first QB node.

22. The display device of claim 21, wherein among the plurality of split cathode electrodes, the at least one split cathode electrode is in a first state applied with a cathode voltage, and the remaining split cathode electrodes are in a second state of floating not applied with the cathode voltage.

23. The display device of claim 22, wherein subpixels including anode electrodes overlapping the split cathode electrode in the second state among the plurality of split cathode electrodes do not emit light.

24. The display device of claim 21, further comprising:
    a plurality of gate lines and a plurality of data lines that cross each other,
    wherein each of the plurality of split cathode electrodes is disposed in a direction parallel to the plurality of gate lines.

* * * * *